US008198618B2

(12) United States Patent
Mikawa et al.

(10) Patent No.: US 8,198,618 B2
(45) Date of Patent: Jun. 12, 2012

(54) NONVOLATILE MEMORY DEVICE AND MANUFACTURING METHOD THEREOF

(75) Inventors: Takumi Mikawa, Shiga (JP); Kenji Tominaga, Kyoto (JP); Kazuhiko Shimakawa, Osaka (JP); Ryotaro Azuma, Osaka (JP)

(73) Assignee: Panasonic Corporation, Osaka (JP)

( * ) Notice: Subject to any disclaimer, the term of this patent is extended or adjusted under 35 U.S.C. 154(b) by 199 days.

(21) Appl. No.: 12/747,060

(22) PCT Filed: Dec. 2, 2008

(86) PCT No.: PCT/JP2008/003551
§ 371 (c)(1),
(2), (4) Date: Jun. 9, 2010

(87) PCT Pub. No.: WO2009/075073
PCT Pub. Date: Jun. 18, 2009

(65) Prior Publication Data
US 2010/0264393 A1 Oct. 21, 2010

(30) Foreign Application Priority Data
Dec. 10, 2007 (JP) .................................. 2007-318133

(51) Int. Cl.
*H01L 29/02* (2006.01)
(52) U.S. Cl. .. 257/2; 257/3; 257/4; 257/5; 257/E29.002; 438/102; 438/103
(58) Field of Classification Search .................. 257/2–5, 257/E29.002; 438/102–103
See application file for complete search history.

(56) References Cited

U.S. PATENT DOCUMENTS

| 6,185,122 | B1 | 2/2001 | Johnson et al. |
| 6,879,508 | B2 | 4/2005 | Tran |
| 2003/0003674 | A1 | 1/2003 | Hsu et al. |
| 2003/0174530 | A1 | 9/2003 | Tran |
| 2004/0090809 | A1 | 5/2004 | Tran |
| 2005/0112846 | A1 | 5/2005 | Meyer et al. |
| 2006/0098472 | A1 | 5/2006 | Ahn et al. |
| 2006/0154432 | A1 | 7/2006 | Arai et al. |
| 2006/0186483 | A1 | 8/2006 | Cho et al. |

(Continued)

FOREIGN PATENT DOCUMENTS

JP 2003-068984 3/2003

(Continued)

*Primary Examiner* — Jami M Valentine
(74) *Attorney, Agent, or Firm* — McDermott Will & Emery LLP

(57) ABSTRACT

A nonvolatile memory device of the present invention comprises a substrate (1), first wires (3), first filling constituents (5) filled into first through-holes (4), respectively, second wires (11) which cross the first wires (3) perpendicularly to the first wires (3), respectively, each of the second wires (11) including a plurality of layers including a resistance variable layer (6) of each of first resistance variable elements, a conductive layer (7) and a resistance variable layer (8) of each of second resistance variable elements which are stacked together in this order, second filling constituents (14) filled into second through-holes (13), respectively, and third wires (15), and the conductive layer (7) of the second wires (11) serves as the electrodes of the first resistance variable elements (9) and the electrodes of the second resistance variable elements (10).

10 Claims, 11 Drawing Sheets

U.S. PATENT DOCUMENTS

| | | |
|---|---|---|
| 2006/0215445 A1 | 9/2006 | Baek et al. |
| 2006/0268594 A1 | 11/2006 | Toda |
| 2007/0132049 A1 | 6/2007 | Stipe |
| 2007/0285966 A1 | 12/2007 | Toda et al. |
| 2007/0285967 A1 | 12/2007 | Toda et al. |
| 2007/0285968 A1 | 12/2007 | Toda et al. |
| 2008/0002455 A1 | 1/2008 | Toda et al. |
| 2008/0002456 A1* | 1/2008 | Toda et al. ............ 365/148 |
| 2008/0002457 A1 | 1/2008 | Toda et al. |
| 2008/0026547 A1 | 1/2008 | Yin et al. |
| 2008/0105878 A1 | 5/2008 | Ohara |
| 2008/0121865 A1 | 5/2008 | Ahn et al. |
| 2008/0258129 A1 | 10/2008 | Toda |
| 2008/0304308 A1 | 12/2008 | Stipe |
| 2010/0032641 A1 | 2/2010 | Mikawa et al. |

FOREIGN PATENT DOCUMENTS

| | | |
|---|---|---|
| JP | 2004-031914 | 1/2004 |
| JP | 2005-159350 | 6/2005 |
| JP | 2005-522045 | 7/2005 |
| JP | 2006-514393 | 4/2006 |
| JP | 2006-140489 | 6/2006 |
| JP | 2006-237605 | 9/2006 |
| JP | 2006-279042 | 10/2006 |
| JP | 2007-165873 | 6/2007 |
| JP | 2007-220768 | 8/2007 |
| JP | 2008-034809 | 2/2008 |
| JP | 2008-118022 | 5/2008 |
| WO | WO 2004/027877 A1 | 4/2004 |
| WO | WO 2007/102341 A1 | 9/2007 |
| WO | WO 2008/062688 A1 | 5/2008 |

* cited by examiner

NONVOLATILE MEMORY DEVICE AND MANUFACTURING METHOD THEREOF

RELATED APPLICATIONS

This application is the U.S. National Phase under 35 U.S.C. §371 of International Application No. PCT/JP2008/003551, filed on Dec. 2, 2008, which in turn claims the benefit of Japanese Application No. 2007-318133, filed on Dec. 10, 2007, the disclosures of which Applications are incorporated by reference herein.

TECHNICAL FIELD

The present invention relates to a cross-point nonvolatile memory device incorporating a resistance variable layer. Particularly, the present invention relates to a configuration in which a resistance variable element is integrated into a wire layer.

BACKGROUND ART

In recent years, with advancement of digital technologies of electronic hardware, memory devices which have a large capacity and are nonvolatile have been developed vigorously to store data of music, image, information and so on. For example, nonvolatile memory devices which are represented by a flash memory have been already used in many fields. However, it is said that miniaturization of the flash memory has almost reached a limit. As memories which are usable in behalf of the flash memory, various memories such as a phase change random access memory (PCRAM), a MRAM, and a FeRAM have been developed. Among them, a ReRAM using a material which is adapted to change its resistance value in response to electric pulses applied and retains the states has attracted an attention because of its high compatibility with a standard semiconductor process and high adaptability for miniaturization.

For example, a cross-point ReRAM which is aimed at miniaturization and achievement of a larger capacity is disclosed (e.g., see Patent document 1). In this ReRAM, stripe-shaped lower electrodes are formed on a substrate and an active layer is formed to cover the entire surface. As the active layer, a resistance variable layer which changes its resistance reversibly in response to electric pulses is used. On the active layer, stripe-shaped upper electrodes are formed to cross the lower electrodes perpendicularly to the lower electrodes, respectively. A region where the lower electrode crosses the upper electrode with the active layer sandwiched between them is a memory section. Each lower electrode serves as either a word line or a bit line, and each upper electrode serves as either the bit line or the word line. It is disclosed that such a cross-point configuration can achieve a larger capacity.

In the cross-point ReRAM, a diode is incorporated to be arranged in series with a resistance variable layer to avoid an influence of resistance variable layers belonging to other rows or columns, which occurs when reading a resistance value of the resistance variable layer formed at a cross point.

For example, a ReRAM is disclosed, comprising a substrate including two or more bit lines arranged in parallel with each other, two or more word lines which are arranged in parallel with each other so as to cross the bit lines, respectively, resistive structures formed on the bit lines at positions where the bit lines cross the word lines, respectively, and diode structures formed on the resistive structures in contact with the resistive structures and the word lines, lower electrodes formed on the substrate, resistive structures formed on the lower electrodes, diode structures formed on the resistive structures, and upper electrodes formed on the diode structures (see Patent document 2).

In such a configuration, a unit cell structure can be formed to have a stacked structure including a single diode structure and a single resistive structure which are stacked together continuously, and an array cell structure is easily attained.

As an example of sharing wires, a cross-point MRAM is disclosed, in which a word line is shared and diode elements and MTJ elements are symmetrically formed on and below the wire, respectively (e.g., see patent document 3). In this configuration, platinum is used for the wire and silicon is provided on and below the wire, thereby a Schottky diode is fabricated.

Patent document 1: Japanese Laid-Open Patent Application Publication No. 2003-68984
Patent document 2: Japanese Laid-Open Patent Application Publication No. 2006-140489
Patent document 3: U.S. Pat. No. 6,879,508 Specification

DISCLOSURE OF THE INVENTION

Problems to be Solved by the Invention

Patent document 1 discloses the cross-point configuration, but fails to disclose or suggest series connection of the diode or its specific structure.

In contrast to the above, Patent document 2 discloses a configuration in which the resistive structures are formed on the lower electrodes, the diode structures are formed on the resistive structures, the upper electrodes are formed on the diode structures, and each diode structure is formed of a p-type oxide and a n-type oxide which are made of NiO, $TiO_2$, or the like. However, in the diode structures and the resistive structures disclosed in patent document 2, since at least four different materials making up the structure are etched together bit by bit, it is very difficult to establish a processing technique required for miniaturization. It is much more difficult to establish a processing technique required for miniaturization, when these materials are etched together with upper and lower electrodes. Moreover, Patent document 2 has a basic problem that the number of process steps and the process cost increase, because it is necessary to provide a plurality of constituents for every individual layer of cross-point memories. Under the circumstances, it is difficult that the cross-point ReRAMs expand their markets in place of the flash memories manufactured at a low process cost.

Patent document 3 discloses a configuration in which upper and lower memory cells share a wire and a Schottky diode is formed by upper and lower interfaces with the wire. However, since the upper electrode of a resistance variable element, a resistance variable element, a lower electrode and a diode element layer are formed together, and at least four different materials making up the structure are etched together bit by bit, it is very difficult to establish a processing technique required for miniaturization, similarly to the above example. If a precious-metal-based electrode which is highly compatible with the resistance variable element is used, etching of them is very difficult. Such a structure is unsuitable for miniaturization.

Prior to conceiving the present invention, we proposed a structure in which one of electrodes of a MSM diode element serves as an upper wire of a cross-point and the other electrode serves as an electrode of a resistance variable element (Japanese Laid-Open Patent Application Publication No. 2006-312590), thereby reducing the number of elements constituting a cross-point memory. In this structure, the effective area of a diode element can be made larger than the area of a resistance variable element. As a result, an ReRAM was achieved, which can ensure a sufficient current supply capability in a cross-point configuration having a combination of diode elements and resistance variable layers and is operable stably.

Although in this structure, the diode element is integrated into a part of the wire structure, the constituents of the cross-point memory cell are still many, if a suitable conductive material is individually selected for an electrode material of the resistance variable layer, an electrode material of the diode and a wire material. When the constituents of the cross-point memory cell are many, a manufacturing method thereof becomes complicated and miniaturization becomes difficult.

The present invention is directed to solving the above described new problem. Particularly, the present invention was conceived by applying discovery that a resistance variable element changes resistance substantially in the vicinity of an interface between a specified one electrode and a resistance variable layer, to a cross-point configuration having a combination of diode elements and resistance variable layers. An object of the present invention is to provide a nonvolatile memory device which can be manufactured easily and is suitable for miniaturization, by using a common electrode of resistance variable elements in upper and lower memory cells, for a wire in an even-numbered layer, by making use of a hierarchical bit line architecture.

Means for Solving the Problem

To achieve the above object, a nonvolatile memory device of the present invention comprises a substrate; a plurality of first wires which are formed on the substrate to extend in parallel with each other; a first interlayer insulating layer formed over the substrate and the first wires; first memory cell holes which are formed in the first interlayer insulating layer on the first wires; first diode elements which are formed inside the first memory cell holes and are connected to the first wires, respectively; a plurality of second wires which are formed on the first interlayer insulating layer to extend in parallel with each other such that the second wires cover upper surfaces of the first diode elements, respectively and cross the first wires perpendicularly to the first wires, respectively, each of the plurality of second wires including a plurality of layers stacked to have a resistance variable layer of each of first resistance variable elements, a conductive layer and a resistance variable layer of each of second resistance variable elements which are stacked together in this order; a second interlayer insulating layer formed over the second wires and the first interlayer insulating layer; second memory cell holes penetrating the second interlayer insulating layer on the second wires; second diode elements which are formed inside the second memory cell holes, respectively, and are connected to the second wires, respectively; and a plurality of third wires which are formed on the second interlayer insulating layer to extend in parallel with each other such that the third wires cover upper surfaces of the second diode elements, respectively and cross the second wires perpendicularly to the second wires, respectively.

To achieve the above object, a nonvolatile memory device of the present invention comprises a substrate; a plurality of first wires which are formed on the substrate to extend in parallel with each other in a first direction; a first interlayer insulating layer formed over the substrate and the plurality of first wires; a plurality of second wires which are formed on the first interlayer insulating layer to extend in parallel with each other in a second direction crossing the first direction when viewed in a thickness direction of the first interlayer insulating layer; a second interlayer insulating layer which is formed over the first interlayer insulating layer and the plurality of second wires; and a plurality of third wires which are formed on the second interlayer insulating layer to extend in parallel with each other in a third direction crossing the second direction when viewed in a thickness direction of the second interlayer insulating layer; wherein a plurality of first through-holes are formed to penetrate the first interlayer insulating layer at three-dimensional cross points of the first wires and the second wires, respectively; and wherein a plurality of second through-holes are formed to penetrate the second interlayer insulating layer at three-dimensional cross points of the second wires and the third wires, respectively; the nonvolatile memory device further comprising: first filling constituents formed inside the first through-holes, respectively; and second filling constituents formed inside the second through-holes, respectively; wherein the first filling constituent is configured to constitute each of first diode elements, or the first filling constituent and the first wire are configured to constitute each of the first diode elements; the second filling constituent is configured to constitute each of second diode elements, or the second filling constituent and the third wire are configured to constitute each of the second diode elements; and each of the second wires has a structure in which the first resistance variable layer, the conductive layer and the second resistance variable layer are stacked together in this order.

In the above configuration, the conductive layer of the second wire can serve as the upper electrode of the first resistance variable element, the lower electrode of the second resistance variable element, and the conductive layer of the wire layer which is its original role. In a conventional configuration, the upper electrode and the lower electrode of the first resistance variable element, and the upper electrode and the lower electrode of second resistance variable element, i.e., four electrodes in total are required. In contrast, in the structure of the present invention, the electrodes required to operate the resistance variable element are reduced to one electrode in the wire layer, except for the electrode of diode element which is also used as the electrode of the resistance variable element. Therefore, the number of process steps and hence the process cost can be reduced. Further, the resistance variable layers of the first resistance variable elements, the resistance variable layers of the second resistance variable elements, and the conductive layers are formed together using line patterns, which does not require microfabrication processing which is equivalent to microfabrication processing employed when forming dot patterns. The active region of the memory cell is determined by the area of the memory cell hole which is easily micro-fabricated, which provides sufficient compatibility with miniaturization. Therefore, it is possible to implement a nonvolatile semiconductor memory device which can be manufactured easily and enables miniaturization at a low-cost by using a common electrode for the resistance variable elements of the upper and lower memory cells, in a cross-point configuration having a combination of diode elements and resistance variable layers.

In the nonvolatile memory device, entire openings at both ends of each of the first through-holes may be covered with the first wire and the second wire, respectively; and entire openings at both ends of each of the second through-holes may be covered with the second wire and the third wire, respectively.

In the nonvolatile memory device, each of the first filling constituents may include a first semiconductor layer which is physically in contact with the first wire and a first electrode layer which is physically in contact with the first semiconductor layer; and each of the second filling constituents may include a second semiconductor layer which is physically in contact with the third wire and a second electrode layer which is physically in contact with the second semiconductor layer.

The nonvolatile memory device may comprise a plurality of constituent units being stacked together, each of the constituent units including the first interlayer insulating layer, the first filling constituents, the plurality of second wires, the second interlayer insulating layer, the second filling constituents and the plurality of third wires.

In such a configuration, for example, in a four-layer cross-point memory structure, the wire layers having resistance variable elements are reduced to two layers, while in an eight-layer cross-point memory structure, the wire layers having resistance variable elements are reduced to four layers. In other words, for example, even when the precious-metal-based electrodes being highly compatible with the resistance variable layers are used in the multi-layer structure, the wire layers including the resistance variable elements can be reduced to about a half. The wire layers used in a standard LSI process may be used as the remaining wires. Therefore, it is possible to implement a nonvolatile semiconductor memory device which has a large capacity without increasing the process cost, in a cross-point configuration having a combination of diode elements and resistance variable layers.

In the nonvolatile memory device, a longitudinal length of each of the second wires may be shorter than a longitudinal length of each of the first wires and a longitudinal length of each of the third wires.

In such a configuration, an electrode material which is suitable for the resistance variable layer may be selected flexibly even from materials with high resistivities. By reducing the length of the second wire, it is possible to prevent a delay of a signal in a wire connected to a circuit for driving a cross-point memory, or a drop of voltages applied to the memory cell.

In the nonvolatile memory device, a thickness of each of the second wires may be smaller than a thickness of each of the first wires and a thickness of each of the third wires.

In such a configuration, the electrode material which is suitable for the resistance variable layers can be selected flexibly even from materials which are processed and polished with difficulty. By reducing the layer thickness of the second wire, patterning by processing and polishing is easily carried out, and the memory cell can be further miniaturized.

In the nonvolatile memory device, a wire resistance of the first wires and a wire resistance of the third wires may be lower than a wire resistance of the second wires.

In such a configuration, since wire layers having resistance variable elements are reduced to the second wire, the wire layers with a lower resistivity may be used for the first and third wires which need not be electrodes of the resistance variable elements. Thereby, it is possible to prevent a delay of a signal in a wire connected to a circuit for driving a cross-point memory, or a drop of voltages applied to the memory cell. In addition, it is possible to achieve a high-speed operation of the memory.

In the nonvolatile memory device, the second wires may include at least one material selected from a group consisting of platinum, iridium, ruthenium, and tungsten. In a configuration in which any of these metals is provided as the conductive layer of the wire, the metal is less likely to react with the resistance variable layer made of a transition metal oxide even when it is subjected to a high-temperature annealing, and the resistance variable layer is allowed to stably change between a low-resistance state and a high-resistance state.

In the nonvolatile memory device including constituent units being stacked together, the plurality of first wires and the plurality of third wires have a word line function (a decoder is connected to the word lines which activate memory cells and enable writing and reading and selects a word line (applies voltages to it), and thereby the memory cell connected to the word line is activated). The plurality of second wires have a bit line function (a sense amplifier is connected to the bit lines to enable writing and reading of data to and from the memory cells, and amplifies a bit line potential, and data is processed as digital signals). The second wires respectively belonging to the constituent units may overlap with each other when viewed in the thickness direction, second wires which belong to (even-number)-th constituent units from the substrate and overlap with each other when viewed in the thickness direction may be electrically connected to each other, and second wires which belong to (odd-number)-th constituent units from the substrate and overlap with each other when viewed in the thickness direction may be electrically connected to each other.

In such a configuration, the memory cells are arranged at cross points between the bit lines extending in X-direction and formed in a plurality of layers and the word lines each of which extends in Y-direction and is formed in a layer between the bit lines. A plurality of basic array planes including common word lines are arranged in Y-direction for each group of bit lines aligned in Z-direction (thickness direction). In other words, a multi-layer cross-point structure is attained. In the respective basic array planes, the bit lines in the even-numbered layer are connected to each other and the bit lines in the odd-numbered layer are connected to each other. By combining select switch elements with the bit lines in the even-numbered layer which are connected to each other and with the bit lines in the odd-numbered layer which are connected to each other, respectively, switching between electric connection and disconnection to a global bit line connected to the select switch elements is controlled. Thus, a hierarchical bit line architecture is achieved. This makes it possible to reduce an array size while minimizing an increase in a layout area.

A method of manufacturing a nonvolatile memory device of the present invention comprises the steps of: forming a plurality of first wires on a substrate such that the first wires extend in parallel with each other; forming a first interlayer insulating layer over the substrate and the plurality of first wires; forming first memory cell holes on the first wires and in predetermined positions of the first interlayer insulating layer, respectively; filling first diode elements into the first memory cell holes, respectively; forming a plurality of second wires on the first interlayer insulating layer such that the second wires extend in parallel with each other, cross the first wires perpendicularly to the first wires, respectively, and cover upper surfaces of the first diode elements, respectively, each of the plurality of second wires including a resistance variable layer of each of first resistance variable elements, a conductive layer and a resistance variable layer of each of second resistance variable elements, which are stacked together in this order; forming a second interlayer insulating layer over the second wires and the first interlayer insulating layer; forming second memory cell holes on the second wires and in predetermined positions of the second interlayer insulating layer; filling second diode elements into the second memory cell holes, respectively; and forming a plurality of third wires on the second interlayer insulating layer such that the third wires extend in parallel with each other and cross the second wires perpendicularly to the second wires, respectively and cover upper surfaces of the second diode elements, respectively.

A method of manufacturing a nonvolatile memory device of the present invention comprises the steps of: forming a plurality of first wires on a substrate such that the first wires extend in parallel with each other in a first direction; forming a first interlayer insulating layer over the substrate and the plurality of first wires; forming a plurality of first through-holes on the first wires, respectively such that the first through-holes penetrate the first interlayer insulating layer and are arranged at predetermined intervals; forming first filling constituents inside the first through-holes, respectively; forming a plurality of second wires on the first interlayer insulating layer such that the second wires extend in parallel with each other in a second direction crossing the first direction when viewed in a thickness direction of the first interlayer insulating layer and cover entire upper end surfaces of the first filling constituents, respectively, each of the plurality of second wires including a first resistance variable layer, a conductive layer and a second resistance variable layer which are stacked together in this order; forming a second interlayer insulating layer over the first interlayer insulating layer and the plurality of second wires; forming a plurality of second through-holes on the second wires, respectively such that the second through-holes penetrate the second interlayer insulating layer and are arranged at predetermined intervals; forming second filling constituents inside the second through-holes; respectively and forming a plurality of third wires on the second interlayer insulating layer such that the third wires extend in parallel with each other in a third direction crossing the second direction when viewed in a thickness direction of the second interlayer insulating layer and cover entire upper end surfaces of the second filling constituents, respectively; wherein the first filling constituent is configured to constitute each of first diode elements, or the first filling constituent and the first wire are configured to constitute each of the first diode elements; and the second filling constituent is configured to constitute each of second diode elements, or the second filling constituent and the third wire are configured to constitute each of the second diode elements.

In such a manufacturing method, the resistance variable layers of the first resistance variable elements, the conductive layers serving as the upper electrodes of the first resistance variable elements, the lower electrodes of the second resistance variable elements, and the conductive layers of the wire layers which are their original roles, and the resistance variable layers of the second resistance variable elements can be formed together. With the above manufacturing method, it is possible to implement a nonvolatile semiconductor memory device which is suitable for miniaturization by using a common electrode for the resistance variable elements of the upper and lower memory cells in a cross-point configuration having a combination of diode elements and resistance variable layers.

In the above manufacturing method, the step of forming the first filling constituents may include: a step a of forming a first semiconductor layer inside each of the first through-holes such that the first semiconductor layer is physically in contact with the first wire; and a step b of forming a first metal electrode layer inside each of the first through-holes such that the first metal electrode layer is physically in contact with the first semiconductor layer, after the step a; and wherein the step of forming the second filling constituents may include: a step c of forming a second electrode layer inside each of the first through-holes such that the second electrode layer is physically in contact with the second wire; and a step d of forming a second semiconductor layer inside each of the second through-holes such that the second semiconductor layer is physically in contact with the second electrode layer, after the step c.

In the above manufacturing method, the step of forming the first wires may be performed by a damascene process in which wire material is filled into predetermined trenches by a CMP process after forming the trenches in the first interlayer insulating layer; wherein the step of forming the second wires may be performed in such a manner that the first resistance variable layer, the conductive layer and the second resistance variable layer are etched using a mask after the first resistance variable layer, the conductive layer and the second resistance variable layer are stacked together in this order; and wherein the step of forming the third wires may be performed by a damascene process in which wire material is filled into predetermined trenches by a CMP process after forming the trenches in the second interlayer insulating layer.

In such a manufacturing method, the second wire having a diode function and having a stacked structure can be formed by etching suitable for processing the stacked structure. Also, the first and third wires which are desirably made of a wire material with a low resistivity can be formed by a damascene process used for wires in a LSI process adapted for standard miniaturization. In other words, by selecting a desired manufacturing method according to a purpose, a nonvolatile semiconductor memory device which is adapted for miniaturization is implemented.

The above and further objects, features and advantages of the present invention will more fully be apparent from the following detailed description of preferred embodiments with accompanying drawings.

Effects of the Invention

With the above described configuration, the present invention has a great advantage that a nonvolatile memory device which can be easily manufactured at a low cost and is adapted for miniaturization by using a common electrode of resistance variable elements of upper and lower memory cells for a wire in an even-numbered layer is implemented, by making use of a feature of a hierarchical bit line architecture, and discovery that the resistance variable element changes its resistance substantially in the vicinity of an interface between specified one electrode and a resistance variable layer in a cross-point configuration.

BRIEF DESCRIPTION OF THE DRAWINGS

FIG. 8 is a process step cross-sectional view for explaining a first manufacturing method of the cross-point memory having a two-layer structure according to Embodiment 1 of the present invention, in which FIG. 8(a) is a view showing a step of forming first wires on a substrate, FIG. 8(b) is a view showing a step of forming a first interlayer insulating layer, FIG. 8(c) is a view showing a step of forming a plurality of through-holes in the first interlayer insulating layer, FIG. 8(d) is a view showing a step of filling semiconductor layers into the first through-holes, respectively, FIG. 8(e) is a view showing a step of filling electrode layers into the first through-holes, respectively, and FIG. 8(f) is a view showing a step of forming second wires.

FIG. 9 is a process step cross-sectional view for explaining the first manufacturing method of the cross-point memory having a two-layer structure according to Embodiment 1 of the present invention, in which FIG. 9(a) is a view showing a step of forming a second interlayer insulating layer, FIG. 9(b) is a view showing a step of forming second through-holes, FIG. 9(c) is a view showing a step of filling electrode layers into the second through-holes, respectively, and FIG. 9(d) is a view showing a step of filling semiconductor layers into the second through-holes, respectively.

FIG. 10 is a process step cross-sectional view for explaining the first manufacturing method of the cross-point memory having a two-layer structure according to Embodiment 1 of the present invention, in which FIG. 10(a) is a view showing a step of forming first lead-out contact plugs 16, and FIG. 10(b) is a view showing a step of forming third wires 15 and first lead-out wires.

FIG. 11 is a process step cross-sectional view for explaining a second manufacturing method of the cross-point memory having a two-layer structure according to Embodiment 1 of the present invention, in which FIG. 11(a) is a view showing a step of forming a first interlayer insulating layer and trenches on a substrate, FIG. 11(b) is a view showing a step of forming first wires by a damascene process, FIG. 11(c) is a view showing a step of forming a first interlayer insulating layer, FIG. 11(d) is a view showing a step of forming a plurality of through-holes in the first interlayer insulating layer, FIG. 11(e) is a view showing a step of filling semiconductor layers into the first through-holes, respectively, and FIG. 11(f) is a view showing a step of filling electrode layers into the first through-holes, respectively.

FIG. 12 is a process step cross-sectional view for explaining a second manufacturing method of the cross-point memory having a two-layer structure according to Embodiment 1 of the present invention, in which FIG. 12(a) is a view showing a step of forming second wires, FIG. 12(b) is a view showing a step of forming a second interlayer insulating layer, FIG. 12(c) is a view showing a step of forming second through-holes, and FIG. 12(d) is a view showing a step of filling electrode layers into the second through-holes, respectively.

FIG. 13 is a process step cross-sectional view for explaining the second manufacturing method of the cross-point memory having a two-layer structure according to Embodiment 1 of the present invention, in which FIG. 13(a) is a view showing a step of filling semiconductor layers into the second through-holes, respectively, FIG. 13(b) is a view showing a step of forming holes into which first lead-out contact plugs are filled, respectively, after a third interlayer insulating layer is formed, FIG. 13(c) is a view showing a step of forming trenches into which third wires and first lead-out wires are filled, and FIG. 13(d) is a view showing a step of forming the third wires and the first lead-out wires by a damascene process.

Figure 1:
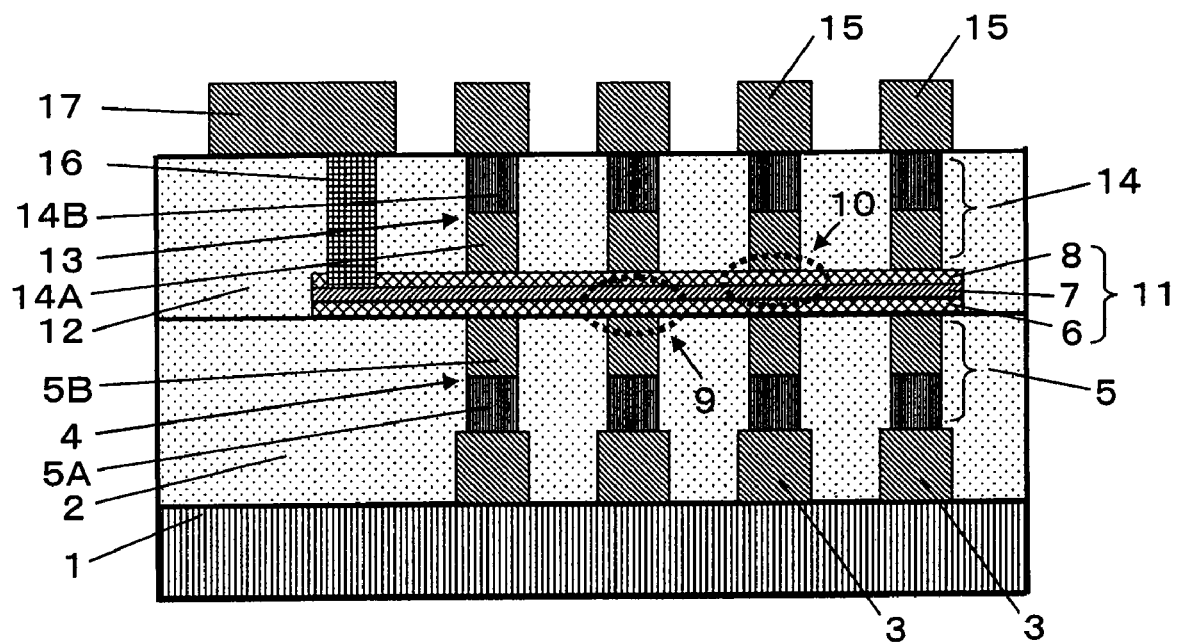
FIG. 1 is a cross-sectional view of a structure of a cross-point memory having a two-layer structure according to Embodiment 1 of the present invention.

| Explanation of Reference Numerals | |
|---|---|
| 1 | substrate |
| 2 | first interlayer insulating layer |
| 2A | first interlayer insulating layer (lower side) |
| 2B | first interlayer insulating layer (upper side) |
| 3 | first wire |
| 3A | trench into which first wire is filled |
| 4 | first through-hole |
| 5 | first filling constituent |
| 5A | semiconductor layer |
| 5B | electrode layer |
| 6 | first resistance variable layer |
| 7 | conductive layer |
| 8 | second resistance variable layer |
| 9 | first resistance variable element |
| 10 | second resistance variable element |
| 11 | second wire |
| 12 | second interlayer insulating layer |
| 13 | second through-hole |
| 14 | second filling constituent |
| 14A | electrode layer |
| 14B | semiconductor layer |
| 15 | third wire |
| 15A | trench into which third wire is filled |
| 16 | first lead-out contact plug |
| 16A | hole into which first lead-out contact plug is filled |
| 17 | first lead-out wire |
| 17A | trench into which first lead-out wire is filled |
| 18 | third interlayer insulating layer |
| 18A | third interlayer insulating layer (lower side) |
| 19 | third through-hole |
| 20 | third filling constituent |
| 21 | third resistance variable layer |
| 22 | conductive layer |
| 23 | fourth resistance variable layer |
| 24 | third resistance variable element |
| 25 | fourth resistance variable element |
| 26 | fourth wire |
| 27 | fourth interlayer insulating layer |
| 28 | fourth through-hole |
| 29 | fourth filling constituent |
| 30 | fifth wire |
| 31 | second lead-out contact plug |
| 32 | second lead-out wire |
| 33 | sixth wire |
| 34 | seventh wire |
| 35 | eighth wire |
| 36 | ninth wire |
| 37 | select switch |
| 38 | select switch |
| 39 | global bit line |

BEST MODE FOR CARRYING OUT THE INVENTION

Hereinafter, embodiments of the present invention will be described with reference to the drawings. Throughout the specification, the same or corresponding constituents are designated by the same reference numerals and description thereof will be omitted in some cases. It should be noted that the shapes of the memory sections and the like are schematically shown, and the number of them are set for easier illustration.

Embodiment 1

FIG. 1 is a cross-sectional view of an exemplary schematic configuration of a cross-point nonvolatile memory device having a two-layer structure according to Embodiment 1 of the present invention, as viewed from the side. The nonvolatile memory device of this embodiment includes a substrate 1, first wires 3 of a stripe shape which are formed on the substrate 1, a first interlayer insulating layer 2 formed over the substrate 1 to cover the first wires 3, second wires 11 of a stripe shape which are formed on the first interlayer insulating layer 2 such that the second wires 11 cross the first wires 3 perpendicularly to the first wires 3, respectively, a second interlayer insulating layer 12 formed over the first interlayer insulating layer 2 to cover the second wires 11, and third wires 15 of a stripe shape which are formed on the second interlayer insulating layer 12.

To be more specific, the nonvolatile memory device of this embodiment includes the substrate 1, the plurality of first wires 3 which are formed on the substrate 1 to form a first flat plane parallel to a main surface of the substrate 1 and respectively extend in parallel with each other in a first direction, a first interlayer insulating layer 2 which is formed over the substrate 1 and the plurality of first wires 3 (to cover them) such that its upper surface is parallel to the main surface of the substrate 1, the plurality of second wires 11 which are formed on the first interlayer insulating layer 2 to form a second flat plane parallel to the first flat plane and respectively extend in parallel with each other in a second direction crossing the first direction (perpendicularly to the first direction in the example of FIG. 1) when viewed in the thickness direction of the first interlayer insulating layer 2, the second interlayer insulating layer 12 which is formed over the first interlayer insulating layer 2 and the plurality of second wires 11 (to cover them) such that its upper surface is parallel to the main surface of the substrate 1, and a plurality of third wires 15 which are formed on the second interlayer insulating layer 12 to form a third flat plane parallel to the second flat plane and extend in parallel with each other in a third direction crossing the second direction when viewed in the thickness direction (thickness direction of the first interlayer insulating layer 2) of the second interlayer insulating layer 12. The first wires 3 and the second wires 11 three-dimensionally cross each other, and the second wires 11 and the third wires 15 three-dimensionally cross each other.

The first through-holes 4 (memory cell holes) are formed in regions (three-dimensional cross-points) where the first wires 3 three-dimensionally cross the second wires 11, respectively such that the first through-holes 4 penetrate the first interlayer insulating layer 2. The first wire 3 is exposed inside each first through-hole 4. A semiconductor layer 5A (first semiconductor layer) and an electrode layer 5B (first electrode layer) are filled into each first through-hole 4 such that the semiconductor layer 5A and the electrode layer 5B are stacked together in this order on the exposed first wire 3. In such a configuration, the first filling constituent 5 electrically connects the first wire 3 to the second wire 11. In the example of FIG. 1, the first wire 3 is configured to physically (directly) contact the semiconductor layer 5A, and the semiconductor layer 5A is configured to physically (directly) contact the electrode layer 5B.

The second through-holes 13 (memory cell holes) are formed in regions (three-dimensional cross-points) where the second wires 11 three-dimensionally cross the third wires 15, respectively such that the second through-holes 13 penetrate the second interlayer insulating layer 12. The second wire 11 is exposed inside each second through-hole 13. An electrode layer 14A (second electrode layer) and a semiconductor layer 14B (second semiconductor layer) are filled into each second through-hole 13 such that the electrode layer 14A and the semiconductor layer 14B are stacked together in this order on the exposed second wire 11. In such a configuration, the second filling constituent 14 electrically connects the second wire 11 to the third wire 15. In the example of FIG. 1, the electrode layer 14A is configured to physically (directly) contact the semiconductor layer 14B, and the semiconductor layer 14B is configured to physically (directly) contact the third wire 15.

In the example of FIG. 1, each of the first filling constituent 5 and the second filling constituent 14 constitutes a diode element (Schottky diode) by itself. The diode element can suppress a leak current (cross leak) flowing through adjacent memory cells. In addition, the Schottky diode can increase a current supply capability of a memory cell because majority carriers are dominant and enables the memory cell to operate at a high-speed. Desirably, the first filling constituent and the second filling constituent are vertically symmetric with respect to the second wire 11, because the second wire also serves as the bit line for the upper and lower resistance variable elements.

Each second wire 11 includes the first resistance variable layer 6, the conductive layer 7 and the second resistance variable layer 8 which are stacked together in this order. The first resistance variable layer 6, the conductive layer 7 and the second resistance variable layer 8 have the same shape when viewed in the thickness direction (direction in which these layers are stacked together, hereinafter the same applies). The first resistance variable layer 6 is configured to connect a plurality of first through-holes 4. The second resistance variable layer 8 is configured to connect a plurality of second through-holes 13.

A first resistance variable element 9 is composed of the electrode layer 5B inside each first through-hole 4, a region of the first resistance variable layer 6 which substantially conforms to the upper opening of the first through-hole 4 when viewed in the thickness direction, and a region of the conductive layer 7 which substantially conforms to the upper opening of the first through-hole 4 when viewed in the thickness direction. That is, the first resistance variable element 9 has a structure in which the first resistance variable layer 6 is sandwiched between the electrode layer 5B and the conductive layer 7. In the example of FIG. 1, the electrode layer 5B is configured to physically (directly) contact the resistance variable layer 6, while the first resistance variable layer 6 is configured to physically (directly) contact the conductive layer 7.

A second resistance variable element 10 is composed of a region of the conductive layer 7 which substantially conforms to the lower opening of each second through-hole 13, when viewed in the thickness direction, a region of the second resistance variable layer 8 which substantially conforms to the lower opening of the second through-hole 13 when viewed in the thickness direction, and the electrode layer 14A of the second through-hole 13. That is, the second resistance variable element 10 has a structure in which the second resistance variable layer 8 is sandwiched between the conductive layer 7 and the electrode layer 14A. In the example of FIG. 1, the conductive layer 7 is configured to physically (directly) contact the second resistance variable layer 8, while the second resistance variable layer 8 is configured to physically (directly) contact the electrode layer 14A.

The conductive layer 7 serves as the electrode of the first resistance variable element 9, the electrode of the second resistance variable element 10, and the conductive layer of the second wire 11.

Each of the first resistance variable element 9 and the second resistance variable element 10 has a characteristic in which a resistance value between the both electrodes changes on application of predetermined currents or voltages between the both electrodes. The resistance value is retained after the application of the currents or voltages stops. With such a characteristic, the first resistance variable element 9 and the second resistance variable element 10 can be used as non-volatile memory elements for storing digital data.

The first resistance variable element 9 and the second resistance variable element 10 are vertically symmetric with respect to the second wire 11. The second wire 11 is connected to the first lead-out wire 17 via a first lead-out contact plug 16 penetrating the second interlayer insulating layer 12. To be specific, the conductive layer 7 of the second wire 11 is electrically connected to the first lead-out wire 17 via a first lead-out contact plug 16 penetrating the second interlayer insulating layer 12 and the second resistance variable layer 8.

As electrode materials (materials of conductive layer 7 and/or electrode layer 5B and/or electrode layer 14A) of the first resistance variable element 9 and the second resistance variable element 10, precious metal electrodes such as platinum, iridium, or ruthenium, tungsten or a combination of these may be used.

As an electrode material (material of electrode layer 5B and/or electrode layer 14A) of the diode element, tantalum nitride may be used.

As the first interlayer insulating layer 2 and the second interlayer insulating layer 12, insulative oxide materials may be used. To be specific, silicon oxide (SiO) deposited by the CVD process, or a TEOS-SiO layer deposited using ozone ($O_3$) and tetraethoxysilane (TEOS) by the CVD process, or a silicon nitride (SiN) layer may be used. Alternatively, silicon carbon nitride (SiCN) layer or silicon oxycarbite (SiOC) layer which is a low dielectric constant material, fluorine-doped silicon oxide (SiOF) layer, etc may be used. It is preferable that the thickness of the first interlayer insulating layer 2 and the thickness of the second interlayer insulating layer 12 are about 100~500 nm. This is because as an inter-wire insulating layer is thinner, an inter-wire leak current increases, while as the inter-wire insulating layer is thicker, the first through-hole 4 and the second through-hole 13 are deeper and it is difficult to process them.

The first resistance variable layer 6 and the second resistance variable layer 8 may be formed using, transition metal oxides, for example, iron-containing oxide such as triiron tetraoxide ($Fe_3O_4$), titanium oxide, tantalum oxide, vanadium oxide, cobalt oxide, nickel oxide, zinc oxide, or niobium oxide layer, by the sputtering process or the like. Such a transition metal oxide material is allowed to exhibit a specific resistance value when it is applied with voltages or currents which are not lower than thresholds and retains the resistance value until it is newly applied with pulse voltages or pulse currents having specified magnitudes.

Each of the first filling constituent 5 and the second filling constituent 14 may be used by itself or may be combined with the first wire 3 or the third wire 15 to constitute a MSM diode in which a semiconductor layer (e.g., nitrogen-deficient silicon nitride layer) is sandwiched between electrodes (e.g., tantalum nitride), a pn-junction diode having a stacked structure consisting of a p-type semiconductor layer and a n-type semiconductor layer, or a Schottky diode forming a Schottky junction using a semiconductor layer and an electrode (see a modification for the detail). Although all of the constituents of each diode element are formed inside the first through-hole 4 or the second through-hole 13, a part of the constituents of the diode element may be formed outside the through-hole (see a modification for the detail).

The semiconductor layer 5A and/or the semiconductor layer 14B may be deposited using, for example, silicon, by sputtering.

The first wire 3 and/or third wire 15 and/or first lead-out wire 17 may be deposited using, for example, copper, by sputtering.

The first lead-out contact plug 16 may comprise tungsten or copper. Or, the first lead-out contact plug 16 has a two-layer structure, in which the upper layer comprises tungsten or copper, and the lower layer comprises titanium, titanium nitride, tantalum and tantalum nitride or a combination of these. This can achieve a lead-out contact with a low contact resistance. The first lead-out contact plug 16 penetrates second resistance variable layer 8 and physically (directly) contacts the conductive layer 7 of the second wire. This is because, metal-metal junction is produced by excluding the second resistance variable layer 8 which easily form a Schottky junction, thereby forming an ohmic contact, and preventing a contact failure.

Figure 2:
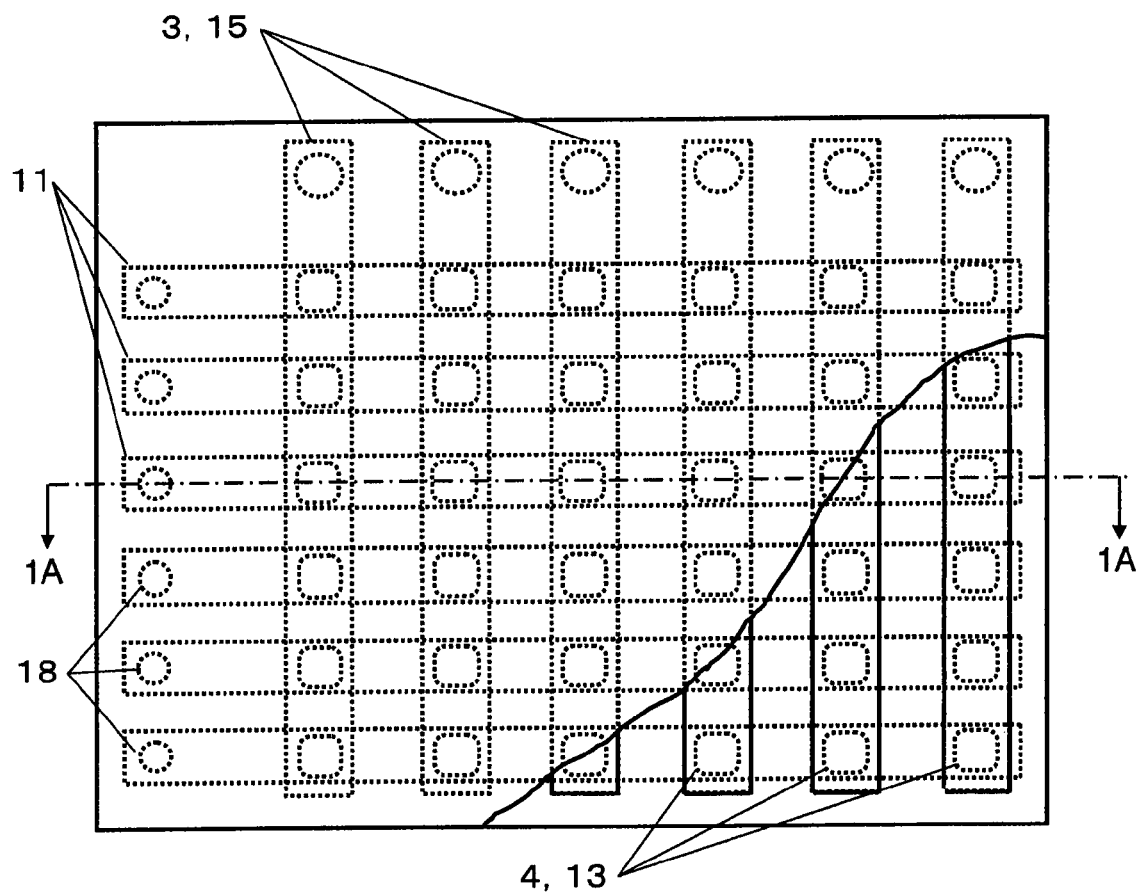
FIG. 2 is a plan view of a cross-point memory having a two-layer structure according to Embodiment 1 of the present invention.

FIG. 2 is a plan view of a cross-point memory having a two-layer memory structure according to Embodiment 1 of the present invention. FIG. 2 shows a configuration made on assumption that an insulating layer covers the second interlayer insulating layer 12 and the third wires 15, and a part of it is removed.

As shown in FIG. 2, the first wire 3 and the second wire 11 cover the entire opening of the first through-hole 4 and are larger in size than the opening of the first through-hole 4 (protrude outward over the opening) when viewed in the thickness direction (from above the substrate 1). Likewise, the second wire 11 and the third wire 15 cover the entire opening of the second through-hole 13 and are larger in size than the opening of the second through-hole 13 (protrudes outward over the opening).

The width (width in a rightward and leftward direction in FIG. 2: lateral width with the longitudinal direction of the first wire 3 being a forward and rearward direction) of the first wire 3 is larger than the width (width in a rightward and leftward direction in FIG. 2: lateral width with the longitudinal direction of the first wire 3 being a forward and rearward direction) of the lower opening of the first through-hole 4. Thus, the first wire 3 covers the entire lower opening of the first through-hole 4 and protrudes outward over the lower opening.

The width (width in an upward and downward direction in FIG. 2: lateral width with the longitudinal direction of the second wire 11 being a forward and rearward direction) of the second wire 11 (first resistance variable layer 6) is larger than the width (width in an upward and downward direction in FIG. 2: lateral width with the longitudinal direction of the second wire 11 being a forward and rearward direction) of the upper opening of the first through-hole 4. Thus, the second wire 11 (first resistance variable layer 6) covers the entire upper opening of the first through-hole 4 and protrudes outward over the upper opening.

The width (width in an upward and downward direction in FIG. 2: lateral width with the longitudinal direction of the second wire 11 being a forward and rearward direction) of the second wire 11 (second resistance variable layer 8) is larger than the width (width in an upward and downward direction in FIG. 2: lateral width with the longitudinal direction of the second wire 11 being a forward and rearward direction) of the lower opening of the second through-hole 13. Thus, the second wire 11 (second resistance variable layer 8) covers the entire lower opening of the second through-hole 13 and protrudes outward over the lower opening.

The width (width in a rightward and leftward direction in FIG. 2: lateral width with the longitudinal direction of the third wire 15 being a forward and rearward direction) of the third wire 15 is larger than the width (width in a rightward and leftward direction in FIG. 2: lateral width with the longitudinal direction of the third wire 15 being a forward and rearward direction) of the upper opening of the second through-hole 13. Thus, the third wire 15 covers the entire upper opening of the second through-hole 13 and protrudes outward over the upper opening.

In the above configuration, the conductive layer 7 of the second wire can serve as the electrode of the first resistance variable element, the electrode of the second resistance variable element, and the conductive layer of the wire layer which is its original role. In a case where the first resistance variable element, the second wire, and the second resistance variable element are stacked together in this order, five electrode layers in total are typically required, which are two electrode layers for the electrode of the first resistance variable element, one electrode layer for the second wire layer, and two electrode layers for the electrode of the second resistance variable element. In this embodiment, these five electrode layers can be reduced to three electrode layers. When the diode element includes the electrode layer, a single electrode layer may be used for the electrode layer of the resistance variable element and the electrode layer of the diode element. As should be understood, in the nonvolatile memory device of this embodiment, the number of the process steps required to form the electrode layers is reduced and the process cost is reduced.

Further, the first resistance variable layers, the second resistance variable layers and the conductive layers are formed together using line patterns, which does not require a microfabrication processing which is equivalent to microfabrication processing when forming dot patterns.

The size and shape of the active region of the memory cell is determined by the area of the opening of the through-hole which is easily micro-fabricated. For this reason, it is not necessary to make the memory cell have a fine structure (form a resistance variable layer and others as having a structure which is substantially as fine as that of the memory cell), which makes it easy to provide highly-integrated memory cells.

As a result, with a simple manufacturing method, a nonvolatile memory device which makes a manufacturing cost lower and is highly integrated is attainable.

Modification

In the above configuration, the longitudinal length of the second wire 11 is desirably set shorter than the longitudinal length of the first wire 3 and/or third wire 15. In such a configuration, even when a material with a higher resistivity is used for the conductive layer 7, a time when a signal travels through the second wire 11 can be reduced, and a potential drop in the second wire 11 can be reduced. Thereby, as the material of the conductive layer 7, an electrode material (precious metal electrode such as platinum, iridium, or ruthenium, or tungsten) which is suitable for function of electrodes of the first and second resistance variable elements can be flexibly selected. Thereby, it is possible to prevent a delay of a signal in a wire between a circuit for driving a cross-point memory and a memory cell, or deficiency of voltages applied to the memory cell which would occur due to a wire resistance.

The second wire 11 may include a layer in addition to the first resistance variable layer 6, the conductive layer 7 and the second resistance variable layer 8. Each of the first resistance variable layer 6, the conductive layer 7 and the second resistance variable layer 8 may have a plurality of layers.

In the configuration in which the longitudinal length of the second wire 11 is shorter than the longitudinal length of the first wire 3 and/or third wire 15, the thickness of the second wire 11 may be smaller than the thickness of the first wire 3 and the thickness of the third wire 15. For example, the first wire 3 and the third wire desirably have thicknesses of about 150 nm~500 nm which allows the wires to work well. In contrast, the second wire 11 has a lower resistance as a whole because its longitudinal length is smaller than those of the first and third wires (the longitudinal length of the second wire 11 is, for example, 5 μm, and the longitudinal lengths of the first and third wires are for example, 150 μm), and can work well even though it is thin. Therefore, the thickness of the second wire 11 must satisfy at least a condition in which the conductive layer 7 serves as the electrode of the resistance variable element. A preferable range of the thickness of the conductive layer 7 is 10 nm~50 nm, and a preferable range of each of the resistance variable layer 6 of the first resistance variable element and the resistance variable layer 8 of the second resistance variable element is 3~30 nm. In view of the above, the second wire 11 desirably has a thickness in a range of 16~110 nm. In such a configuration, the thickness of the second wire 11 can be made extremely small. This makes it easy to perform patterning by processing and polishing. For example, when the second wires 11 are formed by etching, the processing easily completes before a resist has been etched away. In other words, the electrode material (precious metal electrode such as platinum, iridium or ruthenium, or tungsten), which is suitable for the resistance variable element, can be flexibly selected, even though these materials are processed and polished with difficulty.

In the above configuration, the wire resistance of the first wire 3 and the wire resistance of the third wire 15 may be set lower than the wire resistance of the second wire 11. The first wire 3 and the third wire 13 are desirably each composed of the conductive layer made of a material with a lower resistance such as copper or aluminum, or a structure in which a barrier metal such as titanium nitride, titanium, tantalum nitride, or tantalum is stacked to underlie the conductive layer. By using these materials and structures, the wire resistance of the first wire 3 and the wire resistance of the third wire 15 can be made lower than the wire resistance of the second wire 11. Thus, it is possible to prevent a delay of signals in a wire connected to a circuit for driving a cross-point memory, or a drop of voltages applied to a memory cell. Besides, it is possible to achieve a higher-speed operation of the cross-point memory.

As described above, the first filling constituent formed by filling specified material into each first through-hole 4 and the second filling constituent formed by filling specified material into each second through-hole 13 are Schottky diodes. However, this embodiment is not limited to this configuration.

The first filling constituent and the first wire may be configured in any other ways so long as the current path formed by the first wire and the current path formed by the second wire are connected to each other via a corresponding diode element. The second filling constituent and the third wire may be configured in any other ways so long as the current path formed by the second wire and the current path formed by the third wire are connected to each other via a corresponding diode element.

The diode element is meant to include general diode elements (elements having a characteristic in which they exhibit a non-linear current characteristic with respect to voltages with a unidirectional polarity but do not substantially flow a current with respect to voltages with an opposite polarity), or bidirectional current controlling elements (elements which exhibit a non-linear current characteristic with respect to positive and negative voltages, bidirectional diodes). As used herein, the non-linear current characteristic means that the resistance value is larger in a range (low-voltage range) in which an absolute value of the voltage is smaller and is smaller in a range (high-voltage range) in which an absolute value of the voltage is larger.

To be specific, the following modifications may be made.

(1) MSM Diode a

In modification 1, in FIG. 1, the materials of the semiconductor layer 5A, the electrode layer 5B and the first wire 3 are suitably selected so that the first filling constituent and the first wire constitute a MSM diode (diode element). In addition, the materials of the semiconductor layer 14B, the electrode layer 14A and the third wire 15 are suitably selected so that the second filling constituent and the third wire constitute a MSM diode (diode element).

The MSM diode is able to flow a current bidirectionally and enables the operation of a bipolar resistance variable layer operable in a bipolar manner. In addition, since the MSM diode has a high current supply capability, a stable resistance changing operation is achieved.

(2) MSM Diode b

In modification 2, each of the first filling constituent and the second filling constituent constitutes a MSM diode (diode element) having a stacked structure of three layers in which are an electrode layer, a semiconductor layer and an electrode layer are stacked together.

Figure 3:
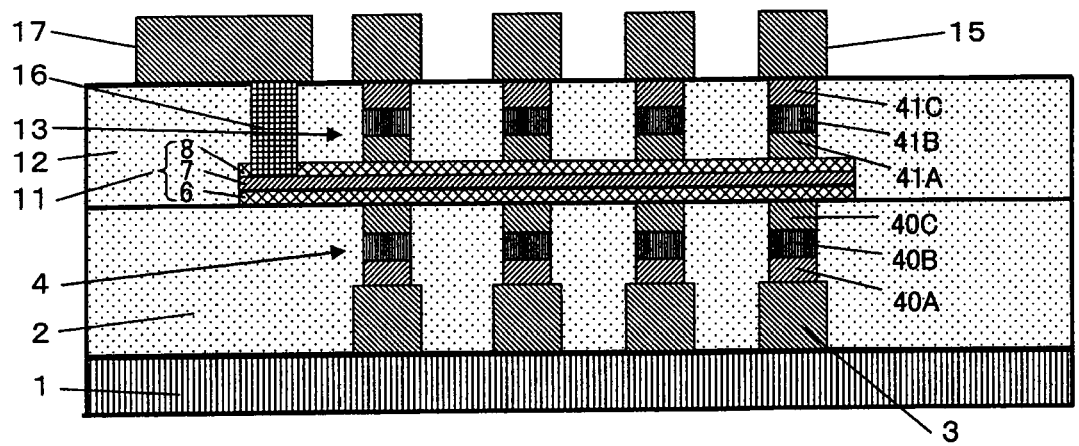
FIG. 3 is a schematic cross-sectional view of a modification 2 of the cross-point memory having a two-layer structure according to Embodiment 1 of the present invention.

FIG. 3 is a schematic cross-sectional view of a modification 2 of a cross-point memory having a two-layer structure according to Embodiment 1 of the present invention. In FIG. 3, the same constituents as those in FIG. 1 are designated by the same reference numerals and will not be described repetitively.

Each first filling constituent 40 has a configuration in which an electrode layer 40A, a semiconductor layer 40B and an electrode layer 40C are stacked together in this order inside the first through-hole 4 such that they are provided on the first wire 3 exposed in the first through-hole 4.

Each second filling constituent 41 has a configuration in which an electrode layer 41A, a semiconductor layer 41B and an electrode layer 41C are stacked together in this order inside the second through-hole 13 such that they are provided on the second wire 11 exposed in the second through-hole 13.

In modification 2, the same advantage as that of modification 1 is achieved. In addition, in modification 2, the materials of the wire layer and the electrode layers are individually selectable. This makes it easy to provide improvement of a signal transmission speed within the wires and a good current steering characteristic of the MSM diode.

(3) MSM Diode c

In modification 3, in FIG. 1, each of the first wire 3 and each of the third wire 15 have a two-layer structure and one layer of the first wire 3 and the first filling constituent constitute a MSM diode (diode element), while one layer of the third wire 15 and the second filling constituent constitute a MSM diode (diode element).

Figure 4:
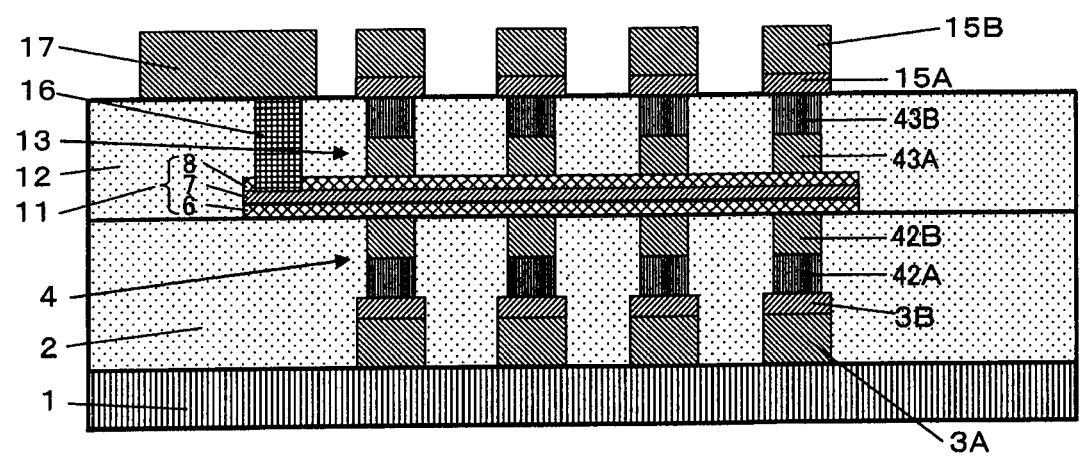
FIG. 4 is a schematic cross-sectional view of a modification 3 of the cross-point memory having a two-layer structure according to Embodiment 1 of the present invention.

FIG. 4 is a schematic cross-sectional view of a modification 3 of a cross-point memory having a two-layer structure according to Embodiment 1 of the present invention. In FIG. 4, the same constituents as those in FIG. 1 are designated by the same reference numerals and will not be described repetitively.

Each first wire 3 has a configuration in which a wire layer 3A and an electrode layer 3B are stacked together in this order on the substrate 1 and have the same shape when viewed from the direction in which the wire layer 3A and the electrode layer 3B are stacked.

Each first filling constituent 42 has a configuration in which a semiconductor layer 42A and an electrode layer 42B are stacked together in this order inside the first through-hole 4 such that they are provided on the electrode layer 3B exposed in the first through-hole 4.

Each second filling constituent 43 has a configuration in which an electrode layer 43A and a semiconductor layer 43B are stacked together in this order inside the second through-hole 13 such that they are provided on the second wire 11 (resistance variable layer 8) exposed in the second through-hole 13.

Each third wire 15 has a configuration in which an electrode layer 15A and a wire layer 15B are stacked together in this order on the second interlayer insulating layer 12 and the semiconductor layer 43B and have the same shape when viewed in a thickness direction (stacking direction).

In modification 3, the same advantage as that of modification 2 is achieved. In addition, in modification 3, since the element layer formed inside the through-hole is composed of two layers, the manufacturing method is simpler than that of modification 2.

The first filling constituent may consist of the electrode layer and the first wire 3 may be configured such that the wire layer, the electrode layer and the semiconductor layer are stacked together in this order and have the same shape when viewed from a thickness direction (stacking direction).

The second filling constituent may consist of the electrode layer and the third wire 15 may be configured such that the semiconductor layer, the electrode layer and the wire layer are stacked together in this order and have the same shape when viewed from a thickness direction (stacking direction).

(4) Pn-Junction Diode

In modification 4, in FIG. 1, each of the first filling constituent and the second filling constituent constitutes a pn-junction diode (diode element) composed of an n-type semiconductor layer and a p-type semiconductor layer which are stacked together.

Figure 5:
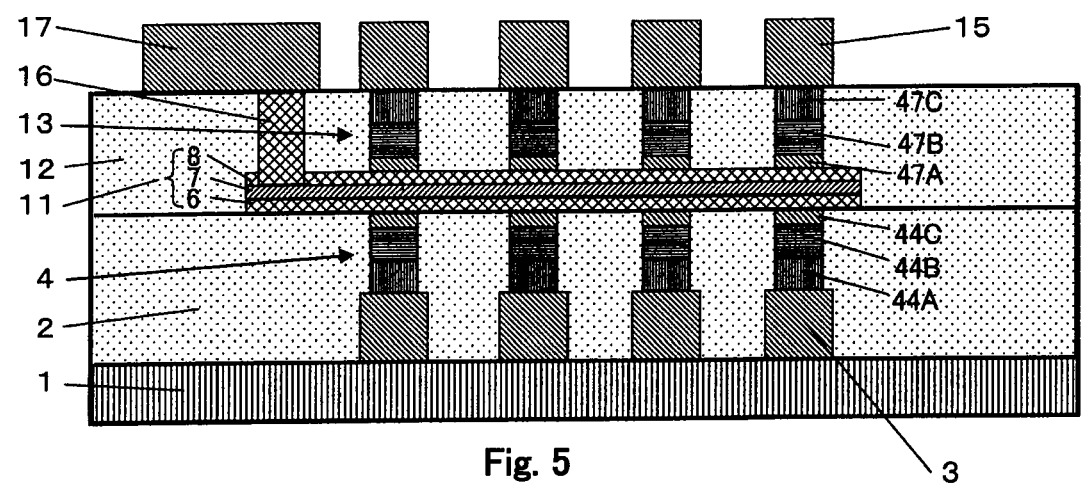
FIG. 5 is a schematic cross-sectional view of a modification 4 of the cross-point memory having a two-layer structure according to Embodiment 1 of the present invention.

FIG. 5 is a schematic cross-sectional view of a modification 4 of a cross-point memory having a two-layer structure according to Embodiment 1 of the present invention. In FIG. 5, the same constituents as those of FIG. 1 are designated by the same reference numerals and will not be descried repetitively.

Each first filling constituent 44 has a configuration in which an n-type semiconductor layer 44A, a p-type semiconductor layer 44B and a connecting electrode layer 44C are stacked together in this order inside the first through-hole 4 such that they are provided on the first wire 3 exposed in the first through-hole 4. The connecting electrode layer 44C is provided to stabilize an electric contact between the p-type semiconductor layer 44B and the resistance variable layer 6 of the second wire 11.

Each second filling constituent 47 has a configuration in which a connecting electrode layer 47A, a p-type semiconductor layer 47B, and an n-type semiconductor layer 47C are stacked together in this order inside the second through-hole 13 such that they are provided on the second wire 11 exposed in the second through-hole 13. The connecting electrode layer 47A is provided to stabilize an electric contact between the second resistance variable layer 8 of the second wire 11 and the p-type semiconductor layer 47B.

Although the current supply capability of the p-n junction diode is lower because minority carriers are dominant in the p-n junction diode, it is expected that an excess current is effectively prevented and electric power consumption is effectively reduced in the p-n junction diode. This makes it possible to further reduce a cross talk when reading and writing occurs, and a circuit configuration for this is simplified. It is desired that the first filling constituent 44 and the second filling constituent 47 be vertically symmetric with respect to the second wire 11, because the second wire 11 can also be used as the bit line of the resistance variable elements located in two layers at the upper and lower sides of the second wire 11.

Embodiment 2

Figure 6:
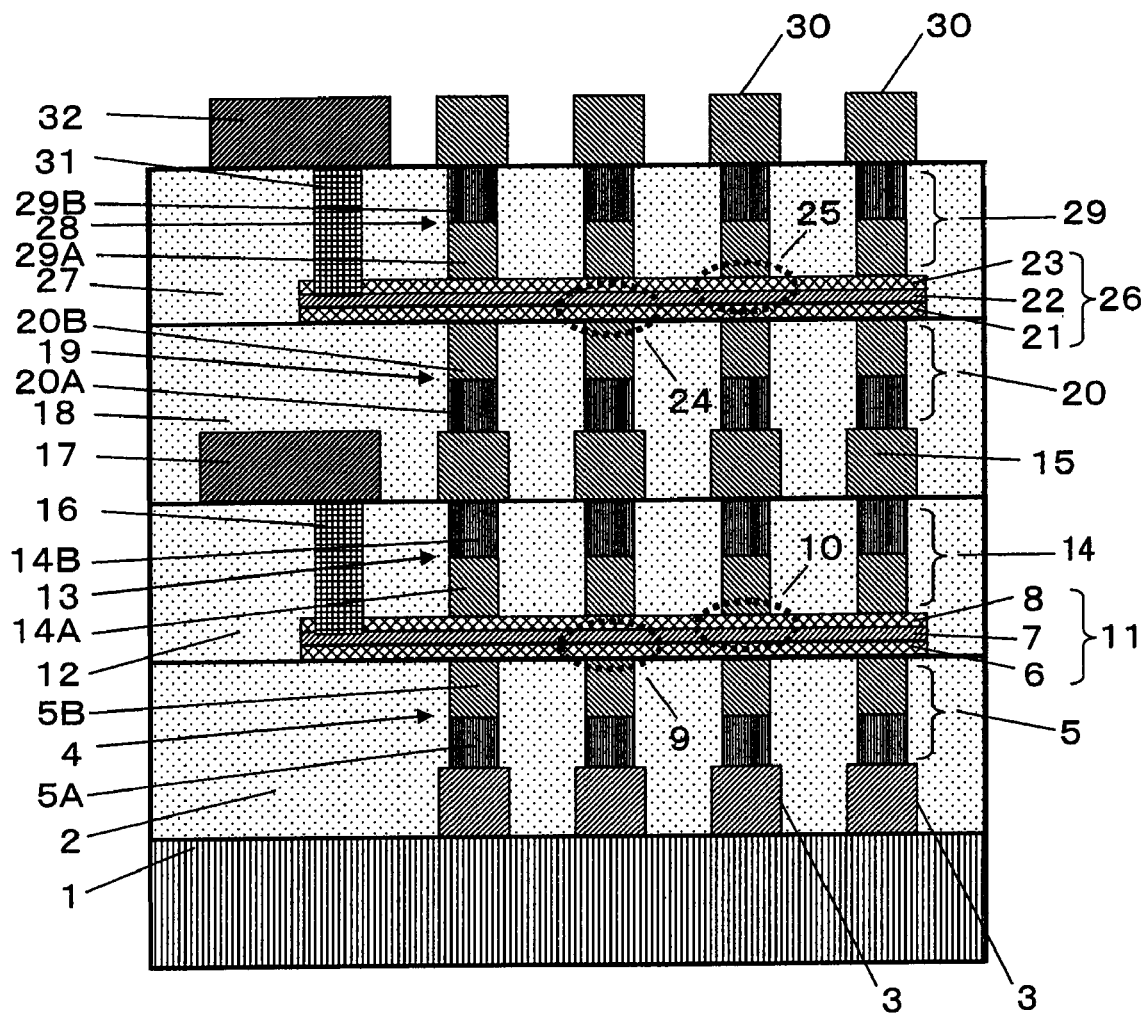
FIG. 6 is a cross-sectional view of a structure of a cross-point memory having a four-layer structure according to Embodiment 2 of the present invention.

FIG. 6 is a cross-sectional view showing an exemplary schematic configuration of a cross-point nonvolatile memory device having a four-layer memory structure according to Embodiment 2 of the present invention, as viewed from the side. Embodiment 2 is different from Embodiment 1 in that two layers of cross-point memories (constituent units each of which is composed of constituents similar to the first interlayer insulating layer 2, the first through-holes 4, the first filling constituents 5, the second wires 11, the second interlayer insulating layer 12, the second through-holes 13, the second filling constituents 14 and the third wires 15 in FIG. 1) are stacked together on the third wires 15. In a stacked structure, the wires located at the top of cross-point memories in lower two layers and the wires located at the bottom of cross-point memories in upper two layers are a common constituent. In FIGS. 1 and 6, the same constituents are designated by the same reference numerals and will not be described repetitively.

To be specific, the nonvolatile memory device is configured to, in addition to the constituents of Embodiment 1, include on the third wires 15, a third interlayer insulating layer 18, fourth wires 26 of a stripe shape which are formed on the third interlayer insulating layer 18 such that the fourth wires 26 cross the third wires 15 perpendicularly to the third wires 15, respectively, a fourth interlayer insulating layer 27 formed over the third interlayer insulating layer 18 to cover the fourth wires 26, and fifth wires 30 of a stripe shape which are formed on the fourth interlayer insulating layer 27. Since the third interlayer insulating layer 18, the fourth interlayer insulating layer 27 and the fifth wires 30 are similar in configuration to the first interlayer insulating layer 2, the second interlayer insulating layer 12 and the first wires 3 (or third wires 15), they will not be described in detail repetitively.

Third through-holes 19 (memory cell holes) are formed in regions of the third interlayer insulating layer 18 where the third wires 15 cross the fourth wires 26 perpendicularly to the fourth wires 26, respectively. Inside each third through-hole 19, a third filling constituent 20 is formed to include a semiconductor layer 20A and an electrode layer 20B and is connected to the third wire 15. Fourth through-holes 28 (memory cell holes) are formed in the fourth interlayer insulating layer 27 in regions where the fourth wires 26 cross the fifth wires 30 perpendicularly to the fifth wires 30, respectively. Inside each fourth trough-hole 28, a fourth filling constituent 29 is formed to include an electrode layer 29A and a semiconductor layer 29B and is connected to the fourth wire 26. The third through-hole 19 and the third filling constituent 20 are similar in specific configuration to the first through-hole 4 and the first filling constituent 5, and therefore will not be described in detail repetitively. The fourth through-hole 28 and the fourth filling constituent 29 are similar in specific configuration to the second through-hole 13 and the second filling constituent 14, and therefore will not be described in detail repetitively.

Each fourth wire 26 comprises a third resistance variable layer 21, a conductive layer 22, and a fourth resistance variable layer 23 which are stacked together in this order. The fourth wire 26 is similar in configuration to the second wires 11 and will not be descried in detail repetitively.

Each conductive layer 22 serves as the electrode of a third resistance variable element 24, the electrode of a fourth resistance variable element 25 and the conductive layer of the fourth wire 26.

Each third resistance variable element 24 is composed of an electrode layer 20B, the third resistance variable layer 21 and the conductive layer 22. The specific configuration of the third resistance variable element 24 is similar to that of the first resistance variable element 9 and will not be descried repetitively.

Each fourth resistance variable element 25 is composed of the conductive layer 22, the fourth resistance variable layer 23 and an electrode layer 29A. The specific configuration of the fourth resistance variable element 25 is similar to that of the second resistance variable element 10 and therefore will not be described repetitively.

The third resistance variable element 24 and the fourth resistance variable element 25 are vertically symmetric with respect to the fourth wire 26. The fourth wire 26 is connected to the second lead-out wire 32 via a second lead-out contact plug 31 penetrating the fourth interlayer insulating layer 27. The specific configuration of the second lead-out contact plug 31 is similar to that of the first lead-out contact plug 16, and therefore will not be described repetitively. The specific configuration of the second lead-out wire 32 is similar to that of the first lead-out wire 17 and therefore will not be described repetitively.

In the above described four-layer cross-point memory structure of this embodiment, the wire layers serving as the electrodes of the resistance variable elements are two layers, which are the wire layers 11 and 26. In other words, even when precious-metal-based electrodes being highly compatible with the resistance variable layer are used, the wire layers serving as the electrodes of the resistance variable elements can be reduced to about a half. In other words, as the remaining wires, wire layers which are used in a standard LSI process may be provided. Therefore, it is possible to implement a nonvolatile memory device which has a large capacity in a cross-point configuration having a combination of the diode elements and the resistance variable layers while suppressing an increase in the process cost.

The third filling constituent 20, the fourth filling constituent 29, the third interlayer insulating layer 18, the fourth interlayer insulating layer 27, the third resistance variable layer 21, the fourth resistance variable layer 23 and the second lead-out contact plug 31 are similar in specific configuration to those described in Embodiment 1, and therefore will not be described repetitively.

Embodiment 3

Figure 7:
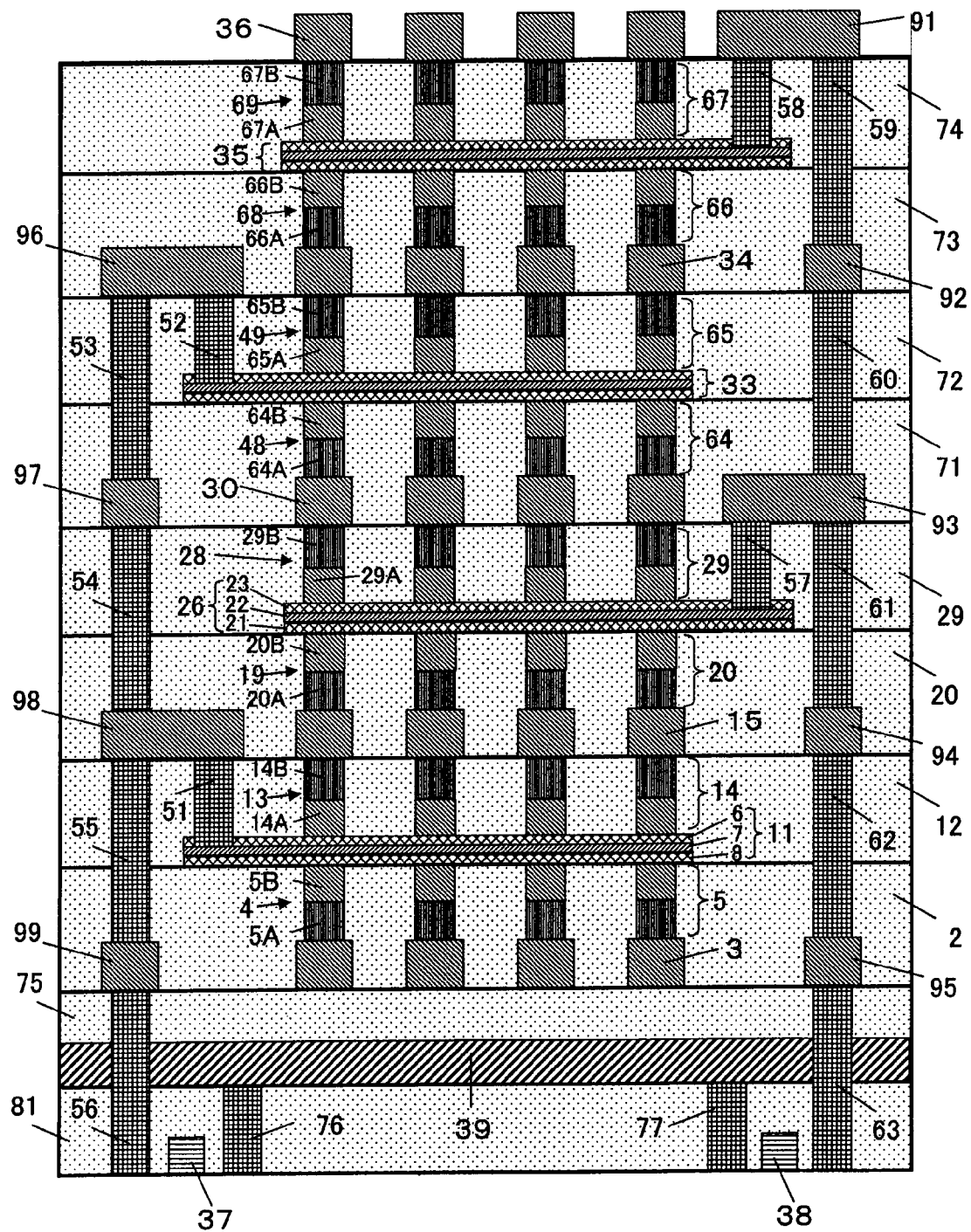
FIG. 7 is a cross-sectional view of a structure of an eight-layer cross-point memory having a hierarchical bit line architecture according to Embodiment 3 of the present invention.

FIG. 7 is a cross-sectional view showing an exemplary schematic configuration of a nonvolatile memory device having an eight-layer cross-point configuration and a hierarchical bit line architecture according to Embodiment 3 of the present invention, as viewed from the side. In Embodiment 3, the structure of Embodiment 1 is formed into a multi-layer structure and is applied to a hierarchical bit line architecture. In FIGS. 1 and 7, the same constituents are designated by the same reference numerals and will not be described repetitively.

As used herein, the hierarchical bit line architecture refers to an array configuration in which the bit lines have a hierarchical structure consisting of a global bit line (main bit line) and sub-bit lines and memory cells are connected in parallel with the sub-bit lines, respectively. The hierarchical bit line architecture is directed to individually driving divided units to provide an improved read operation margin and a higher-speed read operation which are adapted for a large-sized array mat. Since the detailed structure is similar to that described in Embodiment 1, it will not be described repetitively. In FIG. 7, reference numerals 71, 72, 73 and 74 designate fifth to eighth interlayer insulating layers, respectively, and reference numerals 51~63 designate lead-out contact plugs, respectively. 75 designates an interlayer insulating layer, and 76 and 77 designate lead-out contact plugs. 39 designates the global bit line for interconnecting the bit lines in the respective layers. A substrate which is not shown is provided under the interlayer insulating layer 75.

A fifth through-hole 48, a sixth through-hole 49, a seventh through-hole 68, and an eighth through-hole 69 are similar in configuration to the first through-hole 4, the second through-hole 13, the third through-hole 19, and the fourth through-hole 28, respectively.

A fifth filling constituent 64, a sixth filling constituent 65, a seventh filling constituent 66 and an eighth filling constituent 67 are similar in configuration to the first filling constituent 5, the second filling constituent 14, the third filling constituent 20 and the fourth filling constituent 29, respectively.

Semiconductor layers 64A, 65B, 66A, and 67B are similar in configuration to the semiconductor layers 5A, 14B, 20A and 29B, respectively.

Electrode layers 64B, 65A, 66B and 67A are similar in configuration to the electrode layers 5B, 14A, 20B and 29A, respectively.

A sixth wire 33 and an eighth wire 35 are similar in configuration to the second wire 11 and the fourth wire 26, respectively.

A seventh wire 34 and a ninth wire 36 are similar in configuration to the third wire 15 and the fifth wire 30, respectively.

In the configuration of the nonvolatile memory device of this embodiment, as shown in FIG. 7, the first wires 3, the third wires 15, the fifth wires 30, the seventh wires 34 and the ninth wires 36 extend in X-direction (direction perpendicular to the sheet of the drawing) and operate as word lines (activate the memory cells to place them into a state where writing and reading of data are enabled, to be specific, a decoder is connected to the word lines, and when the decoder selects a word line (applies voltages), the memory cell connected to the word line is activated). In contrast, the second wires 11, the fourth wires 26, the sixth wires 33 and the eighth wires 35 into which the resistance variable elements of the upper and lower memory cells are integrated extend in Y-direction (lateral direction in the drawing) and operate as bit lines (sub-bit lines) (operate as data lines used for writing and reading data to and from the memory cells, a sense amplifier is connected to the bit lines and amplifies the potentials of bit lines, and data are processed as digital signals). The bit lines are arranged to overlap with each other in Z-direction (stacking direction). The fourth wires 26 and the eighth wires 35 which are bit lines in even-numbered layers are connected to each other (electrically connected to each other via electrode layers) via lead-out contact plugs 57~63 and lead-out wires 91~95 and are connected to each FET transistor connected to the global bit line 39 via a lead-out contact plug 77. A select switch 38 is a gate electrode of each FET transistor. In other words, each FET transistor is constituted by the substrate (not shown) and the select switch 38. The second wires 11 and the sixth wires 33 which are bit lines in odd-numbered layers are connected to each other (electrically connected to each other via electrode layers) via lead-out contact plugs 51~56 and lead-out wires 96~99 and are connected to each FET transistor connected to the global bit line 39 via a lead-out contact plug 76. A select switch 37 is a gate electrode of the FET transistor. In other words, each FET transistor is constituted by the substrate (not shown) and the select switch 37.

Although the lead-out contact plugs 56 and 63 cross the global bit line 39 in FIG. 4, they are insulated from each other in crossing regions actually.

In such a configuration, the memory cells are formed at cross-points (three-dimensional cross-points) where the word lines extending in X-direction and formed in a plurality of layers respectively cross the bit lines each of which extends in Y-direction and is located in the layer between the associated word lines, and a plurality of basic array planes including common word lines are arranged in Y-direction for each group of bit lines aligned in Z-direction. In other words, a multi-layer cross-point structure is formed. In the respective basic array planes, the bit lines in the even-numbered layer are connected to each other and the bit lines in the odd-numbered layer are connected to each other. By combining the select switch elements with the bit lines in the even-numbered layer which are connected to each other and the bit lines in the odd-numbered layer which are connected to each other, respectively, switching between electric connection and disconnection to the global bit line connected to the select switch elements is controlled. Thus, a hierarchical bit line architecture is achieved. This makes it possible to attain a nonvolatile memory device which can reduce an array size without substantially increasing a layout area.

Since the bit lines are divided, which is a feature of the hierarchical bit line architecture, i.e., the bit lines are formed to have a hierarchical structure consisting of the global bit line (main bit line) having a longer length and sub-bit lines having a shorter length, and the sub-bit lines are arranged in the respective array planes, the length of the bit lines in the respective array planes is reduced. By reducing the wire layers having a function of the electrodes of the resistance variable elements and the sub-bit lines to a common constituent, wire layers with a lower resistivity may be used as the remaining word lines having a large length, because the word lines need not serve as the electrodes of the resistance variable elements. This makes it possible to prevent a delay of signals in a wire connected to a circuit for driving a cross-point memory and a drop of the voltages applied to the memory cell, and to achieve a high-speed operation of the memory.

First Manufacturing Method of Embodiment 1

Figure 8:
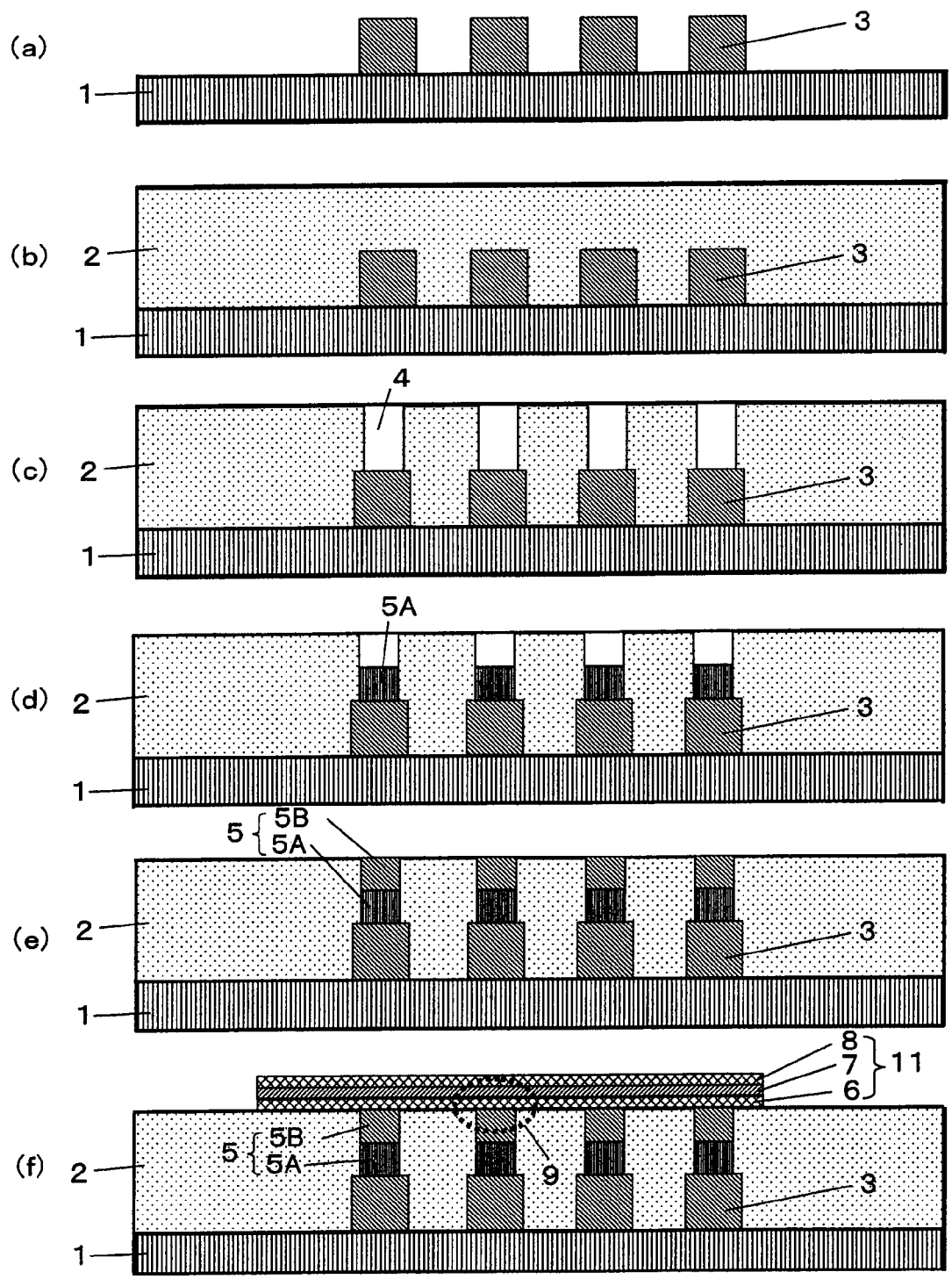
Figure 9:
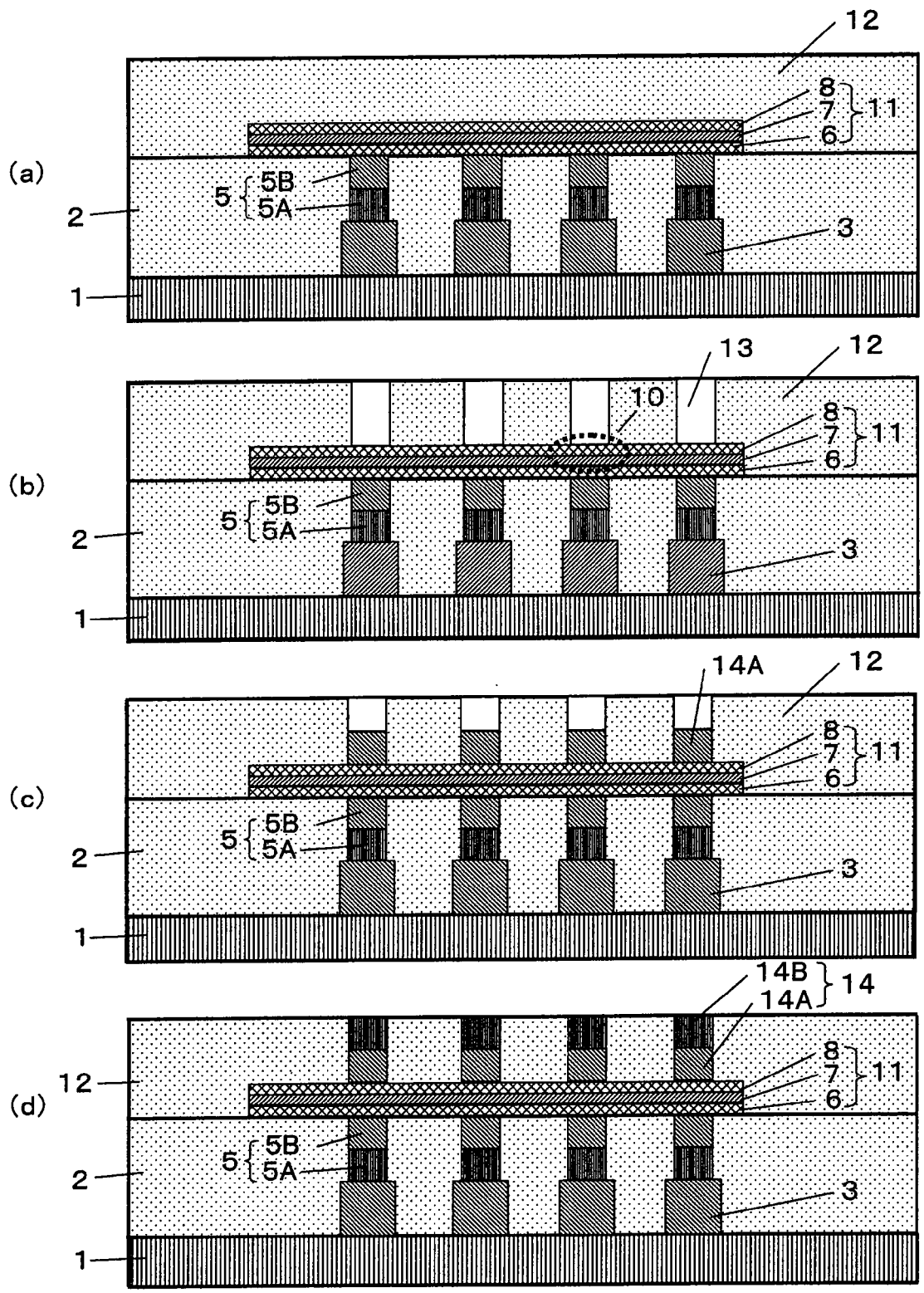
Figure 10:
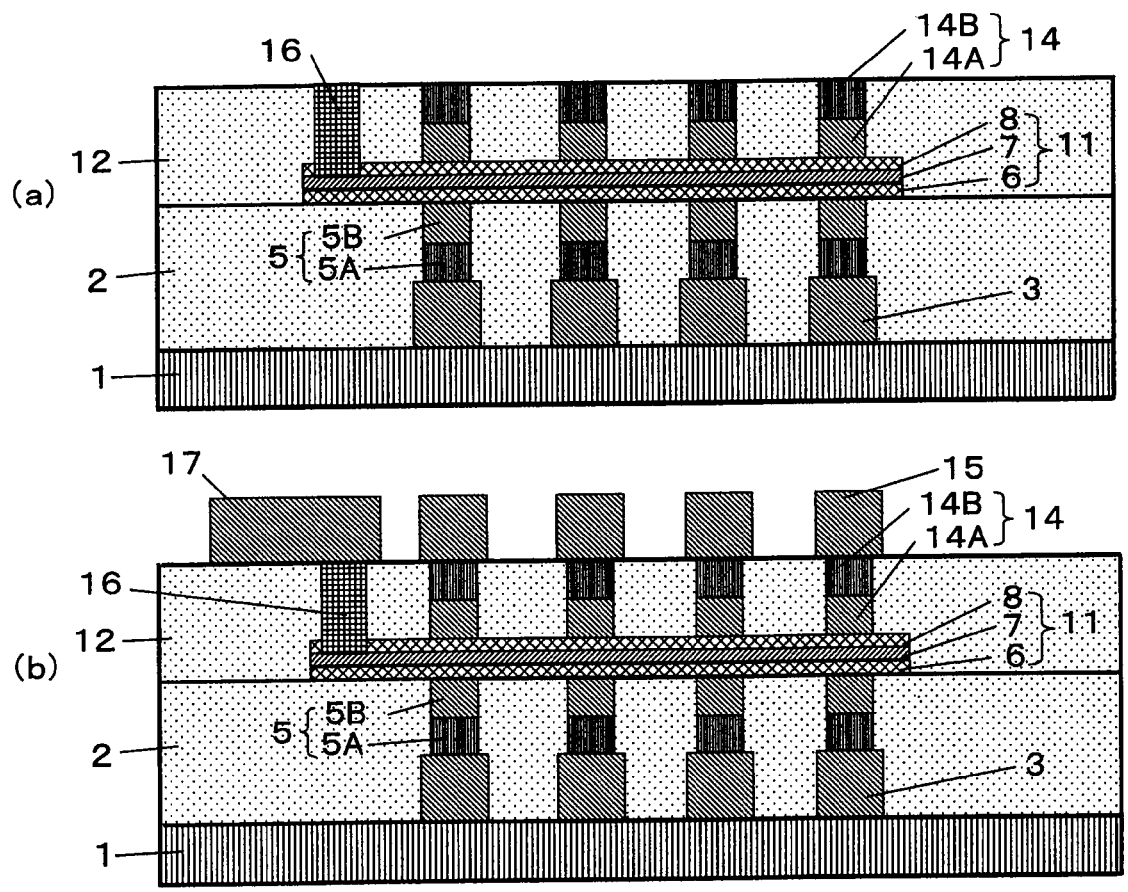

Subsequently, a first manufacturing method of the nonvolatile memory device according to Embodiment 1 of the present invention will be described with reference to FIGS. 8 to 10.

FIG. 8(a) is a cross-sectional view showing a step of forming the first wires 3 of a stripe shape by patterning using a desired mask (sputtering and etching using a mask) on the substrate 1. In this embodiment, the first wires 3 may be composed of aluminum as major component. The wires are formed in a "stripe shape" means that a plurality of wires are formed to respectively extend in parallel with each other and in a predetermined direction. In this step, the plurality of first wires 3 are formed on the substrate 1 to extend in parallel with each other and in a first direction.

Then, as shown in FIG. 8(b), the first interlayer insulating layer 2 is formed over the entire surface of the substrate 1 by sputtering to cover the substrate 1 and the first wires 3 located thereon, and its surface is planarized by CMP. Fluorine-containing oxide (e.g., SiOF) or carbon-containing nitride (e.g., SiCN) is suitably used as the material of the first interlayer insulating layer 2 to reduce a parasitic capacitance between wires.

Then, as shown in FIG. 8(c), the first through-holes 4 are formed at constant arrangement pitches (intervals) along the direction (direction perpendicular to the sheet of FIG. 8(c)) in which the first wires 3 extend, by patterning (etching) using a desired mask such that the first through-holes 4 penetrate the first interlayer insulating layer 2 on the first wires 3 and reach the first wires 3. If the width of the first wire 3 is smaller than the size of the first through-hole 4, the contact area of the first wire 3 and the electrode layer 5B produced later changes due to misalignment between masks, causing a variation in a cell current, for example. To prevent this misalignment, the width (width in a rightward and leftward direction in FIG. 8(c): lateral width with the longitudinal direction of the first wire 3 being a forward and rearward direction) of the first wire 3 is larger than the width (width in a rightward and leftward direction in FIG. 8(c): lateral width with the longitudinal direction of the first wire 3 being a forward and rearward direction) of the lower opening of the first through-hole 4. Thereby, each first wire 3 covers the entire surface of the lower opening of the first through-hole 4 and protrudes outward over the periphery thereof.

Then, as shown in FIG. 8(d), the semiconductor layer 5A which is a first layer of the first filling constituent 5 is filled into each first through-hole 4. As the semiconductor layer 5A, silicon deposited by a sputtering process is used. As the layer forming method, a CVD process, an ALD process, or the like may be used, instead of the sputtering. The semiconductor layer 5A is filled into each first through-hole 4 by the CMP process or an etch-back process. In this case, a recess is formed in the upper portion of each through-hole 4 by conducting overpolishing or the etch-back process.

Then, as shown in FIG. 8(e), the electrode layer 5B which is a second layer of the first filling constituent 5 is filled into the recess of the upper portion of each first through-hole 4. As the electrode layer 5B, tantalum nitride may be used. The layer of tantalum nitride may be deposited by a nitrogen reactive sputtering using tantalum as a target. The layer of tantalum nitride may be filled into the recess of each first through-hole 4 by using the CMP process or the etch-back process. Through the above steps, the first filling constituent 5 which becomes a Schottky diode is formed inside each first through-hole 4. The tantalum nitride of the electrode layer 5B also serves as the electrode of the first resistance variable element.

Then, as shown in FIG. 8(f), the second wires 11 of a stripe shape are formed, each of which includes the first resistance variable layer 6, the conductive layer 7 and the second resistance variable layer 8 which are stacked together in this order. To be specific, in this step, the plurality of second wires 11 are formed on the first interlayer insulating layer 2 to extend in parallel with each other and in a second direction crossing the first direction when viewed in the thickness direction of the first interlayer insulating layer. The second wires 11 are formed using a desired mask such that the second wires 11 physically contact the electrode layers 5B of the first filling constituents 5 and three-dimensionally cross the first wires 3, respectively (for example, perpendicularly to the first wires 3). To be specific, the first resistance variable layer 6, the conductive layer 7 and the second resistance variable layer 8 are deposited by sputtering and then etched using a mask, thereby forming the second wires 11 of a desired shape. In this case, the second wire 11 is formed to cover the entire upper end surface (upper end surface of each electrode layer 5B) of each first filling constituent 5 and to protrude outward over the periphery of the entire upper end surface. The width (width perpendicular to the sheet of FIG. 8(f): lateral width with the longitudinal direction of the second wire 11 being the forward and rearward direction) of the second wire 11 is larger than the width (width perpendicular to the sheet of FIG. 8(f): lateral width with the longitudinal direction of the second wire 11 being the forward and rearward direction) of the upper openings of the first through-hole 4.

Then, as shown in FIG. 9(a), the second interlayer insulating layer 12 is deposited over the first interlayer insulating layer 2 to cover the first interlayer insulating layer 2 and the second wires 11 thereon. The second interlayer insulating layer 12 may be formed by using the material and method for the first interlayer insulating layer 3.

Then, as shown in FIG. 9(b), the second through-holes 13 are formed at constant arrangement pitches (intervals) along the direction (rightward and leftward direction in FIG. 9(b)) in which the second wires extend, by patterning (etching) using a desired mask such that the second through-holes 13 penetrate the second interlayer insulating layer 12 on the second wires 11 and reach the second wires 11. For a similar reason for the first through-holes 4, the width (width perpendicular to the sheet of FIG. 9(b): lateral width with the longitudinal direction of the second wire 11 being the forward and rearward direction) of the second wire 11 is larger than the width (width perpendicular to the sheet of FIG. 9(b): lateral width with the longitudinal direction of the second wire 11 being the forward and rearward direction) of the lower opening of the second through-hole 13. In this way, the second wire 11 covers the entire surface of the lower opening of each second through-hole 13 and protrudes outward over the entire surface. It is desired that the second through-holes 13 be respectively positioned right above the associated first through-holes 4, to achieve miniaturization of the cell layout and maintain symmetric property between the upper and lower cells of the cross-point memory, thereby suppressing a variation in a circuit operation.

Then, as shown in FIG. 9(c), the electrode layer 14A which is a first layer of the second filling constituent 14 is filled into the lower portion of each second through-hole 13, by a CMP process or an etch-back process. As the electrode layer 14A, tantalum nitride may be used. By conducting overpolishing or the etch-back process, a recess is formed in the upper portion of the second through-hole 13. The tantalum nitride of the electrode layer 14A also serves as the electrode of the second resistance variable element.

Then, as shown in FIG. 9(d), the semiconductor layer 14B which is a second layer of the second filling constituent 14 is filled into the upper portion of each second through-hole 13. As the semiconductor layer 14B, silicon deposited by sputtering may be used. The first filling constituent 5 and the second filling constituent 14 are vertically symmetric with respect to the second wire 11. This makes a circuit design easier and lessens a variation in a circuit operation. The forming method of these has already been described with reference to FIGS. 8(d) and 8(e) and will not be described in detail repetitively.

Then, as shown in FIG. 10(a), the first lead-out contact plugs 16 are formed such that each contact plug 16 penetrates the second interlayer insulating layer 12 and is connected to the second wire 11. The first lead-out contact plug 16 may be formed in such a manner that for example, etching is conducted using a desired mask, the contact hole is filled by sputtering and CVD and the surface is planarized by CMP. The first lead-out contact plug 16 may be made of tungsten or copper, or may have a stacked structure which is a combination of tungsten or copper and titanium, titanium nitride, tantalum or tantalum nitride filled under the tungsten or the copper. The first lead-out contact plug 16 penetrates the resistance variable layer 8 of the second resistance variable element and is connected to the conductive layer 7 of the second wire, to form an ohmic contact and to prevent a contact failure Finally, as shown in FIG. 10(b), by patterning using a desired mask (sputtering and etching using a mask), the third wires 15 of a stripe shape and the first lead-out wires 17 are formed. To be specific, in this step, the plurality of third wires 15 are formed on the second interlayer insulating layer 12 to extend in parallel with each other in a third direction crossing the second direction when viewed in the thickness direction of the second interlayer insulating layer, and concurrently, the first lead-out wires 17 are formed. The third wires 15 are formed to physically contact the semiconductor layers 14B of the second filling constituents 14 and three dimensionally-cross the second wires 11 (e.g., perpendicularly to the second wires 11), respectively. In this case, the third wire 15 is formed to cover the entire upper end surface (upper end surface of the semiconductor layer 14B) of the second filling constituent 14 to protrude outward over the periphery of the entire upper end surface. The width (width in a rightward and leftward direction in FIG. 10(b): lateral width with the longitudinal direction of the third wire 15 being a forward and rearward direction) of the third wire 15 is larger than the width (width in a rightward and leftward direction in FIG. 8(f): lateral width with the longitudinal direction of the third wire 15 being a forward and rearward direction) of the upper opening of the second through-hole 13. The first lead-out wire 17 is connected to the first lead-out contact plug 16. After that, an insulating protective layer (not shown) is formed, thereby manufacturing the nonvolatile memory device of Embodiment 1 of the present invention as shown in FIG. 1.

Although in this embodiment, the Schottky diode composed of the electrode layer and the semiconductor layer is used as the first filling constituent 5 and the second filling constituent 14, a p-n junction diode composed of a p-type semiconductor layer and an n-type semiconductor layer which are connected to each other, or a MSM diode composed of an electrode layer, a semiconductor layer and an electrode layer may be formed in each through-hole. In addition, although all of the constituents of the diode element are formed inside each of the first through-hole 4 and the second through-hole 13, a part of the constituents may be formed outside each through-hole.

Second Manufacturing Method of Embodiment 1

Figure 11:
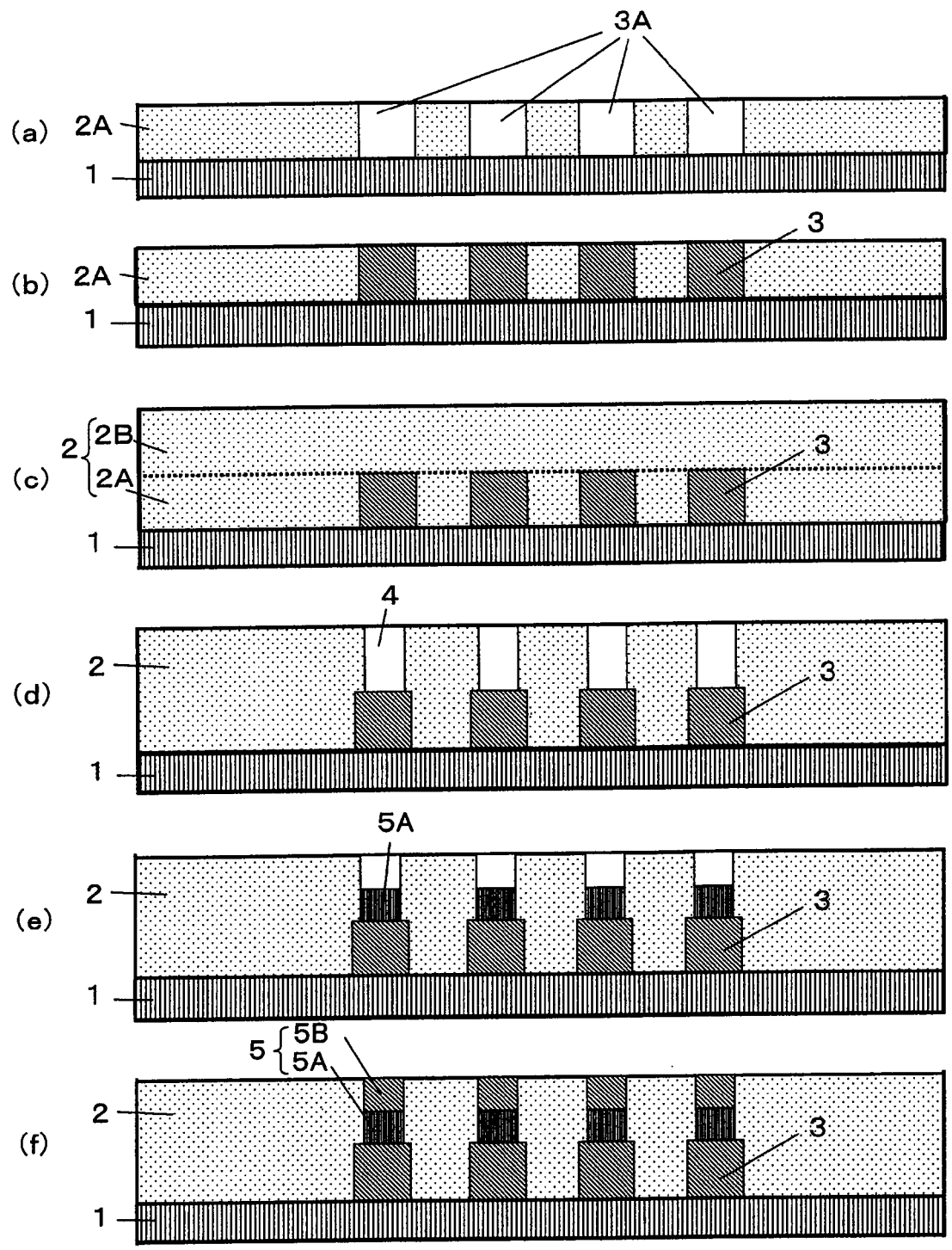
Figure 12:
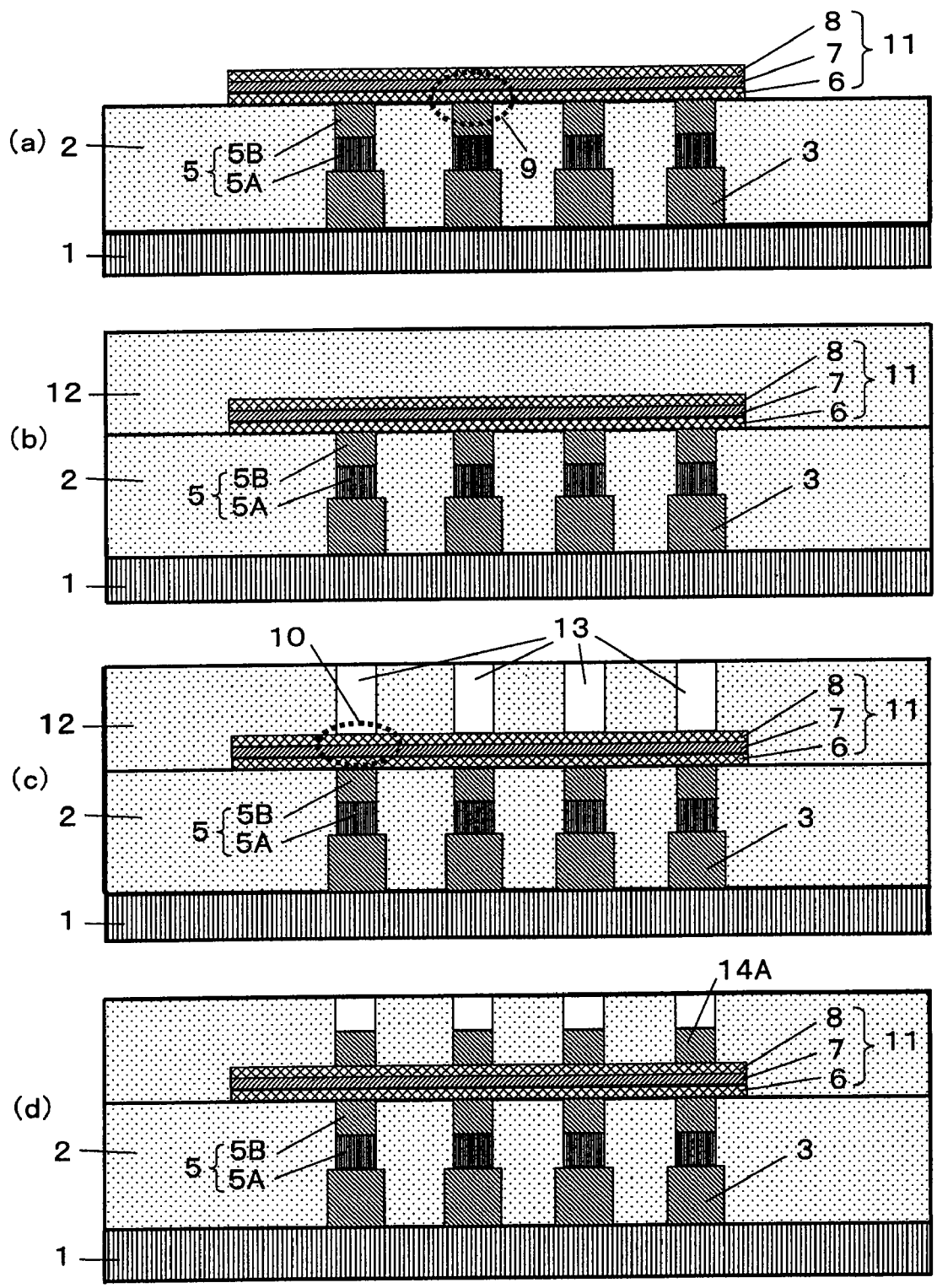
Figure 13:
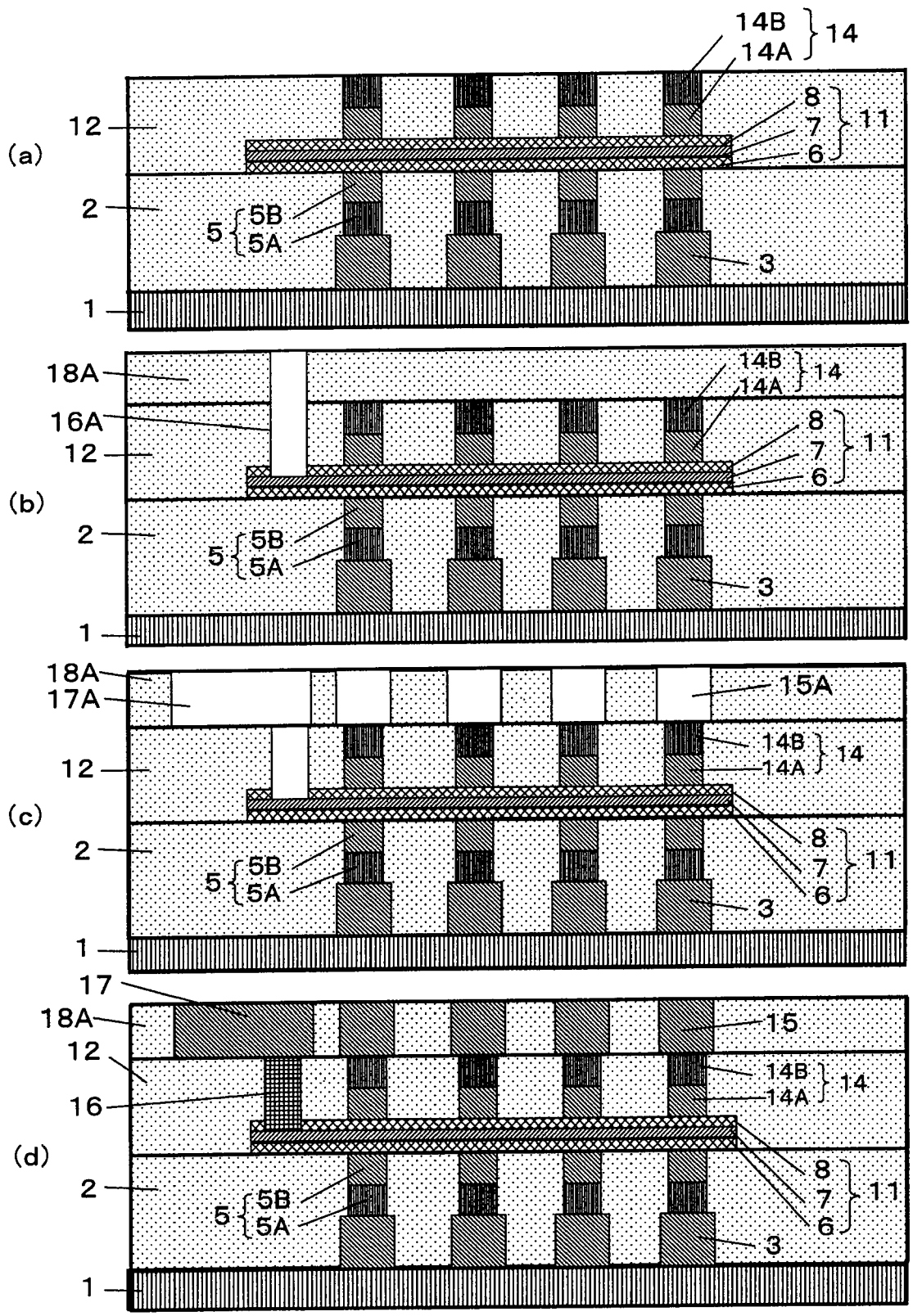

Subsequently, a second manufacturing method of the nonvolatile memory device according to Embodiment 1 of the present invention will be described with reference to FIGS. 11 to 13. Since the steps from the step in FIG. 11(d) which is a step of forming the first through-holes 4 in the first insulating layer 2 to the step in FIG. 13(a) which is a step of filling the second filling constituents 14 into the second through-holes 13 are similar to those shown in FIGS. 8(c) to 9(d), they will not be described repetitively. In addition, since the materials and others of the wires, the interlayer insulating layers, the resistance variable layers, the filling constituents, and the contacts are similar to those described in the specific configuration of the first manufacturing method of Embodiment 1 of the present invention, they will not be described repetitively.

FIG. 11(a) is a cross-sectional view showing a step of forming trenches 3A into which the first wires 3 are filled in predetermined positions of a first interlayer insulating layer 2A after forming the first interlayer insulating layer 2A over the entire surface of the substrate 1. This step may be implemented by conducting etching using a desired mask after the first interlayer insulating layer 2A is deposited by sputtering.

Then, as shown in FIG. 11(b), after forming a conductive layer which becomes the first wires 3, the first wires 3 are formed in a damascene process using a CMP. The material of the first wires 3 contains as major component Cu which has a lower resistance, is adapted for miniaturization and has been already introduced in a state-of-the-art LSI process.

Then, as shown in FIG. 11(c), a first interlayer insulating layer 2B is formed over the entire upper end surfaces of the first wires 3 and the entire upper end surface of the first interlayer insulating layer 2A by sputtering so as to cover the first wires 3.

The steps shown in FIG. 11(d)~FIG. 13(a) are similar to the steps shown in FIG. 8(c)~9(d) described in Embodiment 1. It should be noted that the second wires 11 are formed by etching using a desired mask. In a case where each second wire 11 has a stacked structure in which the plural constituents of the resistance variable element are integrated into (formed integrally with) the second wire 11, and when the second wire 11 can be thinned, a pattern is formed by etching adapted for miniaturization.

Then, as shown in FIG. 13(b), a third interlayer insulating layer 18A is formed over the second interlayer insulating layer 12 by sputtering to cover the second through-holes 13, and then, holes 16A into which the first lead-out contact plugs penetrating the second interlayer insulating layer 12 and the third interlayer insulating layer 18A are filled, are formed by etching using a mask. The holes 16A into which the first lead-out contact plugs are filled are formed such that each hole 16A penetrates the second resistance variable layer 8 to expose the conductive layer 7 of second wire, to form an ohmic contact and to prevent a contact failure. As the third interlayer insulating layer 18A, a fluorine-containing oxide (e.g., SiOF) or carbon-containing nitride (e.g., SiCN) is suitably used, to reduce a parasitic capacitance between wires.

Then, as shown in FIG. 13(c), trenches 15A into which the third wires 15 are filled, respectively and trenches 17A into which the first lead-out wires are filled, respectively, are formed in predetermined positions of the third interlayer insulating layer 18A, by etching using a mask. Each trench 15A is formed to expose the semiconductor layer 14B in each second through-hole 13, while each trench 17A is formed to contain the hole 16A into which the first lead-out contact plug 16 is filled.

Finally, as shown in FIG. 13(d), after forming a conductive layer which becomes the third wires 15 and the first lead-out wires 17, the trenches 15A and 17A and the holes 16A are filled with the materials by a damascene process using CMP. In this way, the third wires 15, the first lead-out contact plugs 16, and the first lead-out wires 17 are formed. The materials of the wires (third wires 15, first lead-out contact plugs 16 and first lead-out wires 17) may contain as major component Cu which has a lower resistance, is adapted for miniaturization and has already been introduced into a state-of-the-art LSI process. After that, an insulating protective layer (not shown) is formed, thereby manufacturing the nonvolatile memory device of Embodiment 1 of the present invention as shown in FIG. 1.

As should be readily appreciated, the cross-point nonvolatile memory device having a four-layer structure shown in FIG. 6 and the nonvolatile memory device having an eight-layer cross-point hierarchical bit line architecture shown in FIG. 7 are formed by stacking four layers and eight layers, by using the first manufacturing method or the second manufacturing method as described above in the same manner. Therefore, the detailed manufacturing method and process step views for these cases will not be described in detail respectively.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention relates to a cross-point nonvolatile memory device including diode elements and resistance variable layers and implements a nonvolatile memory which has a very large memory capacity. Therefore, the present invention is useful in fields of various electronic hardware incorporating the nonvolatile memory device.

The invention claimed is:

1. A nonvolatile memory device comprising:
a substrate;
a plurality of first wires which are formed on the substrate to extend in parallel with each other in a first direction;
a first interlayer insulating layer formed over the substrate and the plurality of first wires;
a plurality of second wires which are formed on the first interlayer insulating layer to extend in parallel with each other in a second direction crossing the first direction when viewed in a thickness direction of the first interlayer insulating layer;
a second interlayer insulating layer which is formed over the first interlayer insulating layer and the plurality of second wires; and
a plurality of third wires which are formed on the second interlayer insulating layer to extend in parallel with each other in a third direction crossing the second direction when viewed in a thickness direction of the second interlayer insulating layer;
wherein a plurality of first through-holes are formed to penetrate the first interlayer insulating layer at three-dimensional cross points of the first wires and the second wires, respectively; and
wherein a plurality of second through-holes are formed to penetrate the second interlayer insulating layer at three-dimensional cross points of the second wires and the third wires, respectively; the nonvolatile memory device further comprising:
first filling constituents formed inside the first through-holes, respectively; and
second filling constituents formed inside the second through-holes, respectively;
wherein the first filling constituent is configured to constitute each of first diode elements, or the first filling constituent and the first wire are configured to constitute each of the first diode elements;
the second filling constituent is configured to constitute each of second diode elements, or the second filling constituent and the third wire are configured to constitute each of the second diode elements; and
each of the second wires has a structure in which the first resistance variable layer, the conductive layer and the second resistance variable layer are stacked together in this order;
a longitudinal length of each of the second wires is shorter than a longitudinal length of each of the first wires and a longitudinal length of each of the third wires;
a wire resistance of the first wires and a wire resistance of the third wires are lower than a wire resistance of the second wires;
the conductive layer of each of the second wires is made of precious metal or tungsten; and
the first wires and the third wires are made of aluminum or copper.

2. The nonvolatile memory device according to claim 1, wherein entire openings at both ends of each of the first through-holes are covered with the first wire and the second wire, respectively; and
wherein entire openings at both ends of each of the second through-holes are covered with the second wire and the third wire, respectively.

3. The nonvolatile memory device according to claim 1, wherein each of the first filling constituents includes a first semiconductor layer which is physically in contact with the first wire and a first electrode layer which is physically in contact with the first semiconductor layer; and
wherein each of the second filling constituents includes a second semiconductor layer which is physically in contact with the third wire and a second electrode layer which is physically in contact with the second semiconductor layer.

4. The nonvolatile memory device according to claim 1, comprising a plurality of constituent units being stacked together, each of the constituent units including the first interlayer insulating layer, the first filling constituents, the plurality of second wires, the second interlayer insulating layer, the second filling constituents and the plurality of third wires.

5. The nonvolatile memory device according to claim 1, wherein a thickness of each of the second wires is smaller than a thickness of each of the first wires and a thickness of each of the third wires.

6. The nonvolatile memory device according to claim 1, wherein the second wires include at least one material selected from a group consisting of platinum, iridium, and ruthenium.

7. The nonvolatile memory device according to claim 4, wherein the plurality of first wires and the plurality of third wires have a word line function;
wherein the plurality of second wires have a bit line function;
wherein the second wires respectively belonging to the constituent units overlap with each other when viewed in a thickness direction of the second wires;
wherein second wires which belong to (even-number)-th constituent units from the substrate and overlap with each other when viewed in the thickness direction are electrically connected to each other; and
wherein second wires which belong to (odd-number)-th constituent units from the substrate and overlap with each other when viewed in the thickness direction are electrically connected to each other.

8. A method of manufacturing a nonvolatile memory device comprising the steps of:
forming a plurality of first wires on a substrate such that the first wires extend in parallel with each other in a first direction;
forming a first interlayer insulating layer over the substrate and the plurality of first wires;
forming a plurality of first through-holes on the first wires, respectively such that the first through-holes penetrate the first interlayer insulating layer and are arranged at predetermined intervals;
forming first filling constituents inside the first through-holes, respectively;

forming a plurality of second wires on the first interlayer insulating layer such that the second wires extend in parallel with each other in a second direction crossing the first direction when viewed in a thickness direction of the first interlayer insulating layer and cover entire upper end surfaces of the first filling constituents, respectively, each of the plurality of second wires including a first resistance variable layer, a conductive layer and a second resistance variable layer which are stacked together in this order;

forming a second interlayer insulating layer over the first interlayer insulating layer and the plurality of second wires;

forming a plurality of second through-holes on the second wires, respectively such that the second through-holes penetrate the second interlayer insulating layer and are arranged at predetermined intervals;

forming second filling constituents inside the second through-holes, respectively; and forming a plurality of third wires on the second interlayer insulating layer such that the third wires extend in parallel with each other in a third direction crossing the second direction when viewed in a thickness direction of the second interlayer insulating layer and cover entire upper end surfaces of the second filling constituents, respectively;

wherein the first filling constituent is configured to constitute each of first diode elements, or the first filling constituent and the first wire are configured to constitute each of the first diode elements;

the second filling constituent is configured to constitute each of second diode elements, or the second filling constituent and the third wire are configured to constitute each of the second diode elements;

a longitudinal length of each of the second wires is shorter than a longitudinal length of each of the first wires and a longitudinal length of each of the third wires;

a wire resistance of the first wires and a wire resistance of the third wires are lower than a wire resistance of the second wires;

the conductive layer of each of the second wires is made of precious metal or tungsten; and the first wires and the third wires are made of aluminum or copper.

9. The method of manufacturing the nonvolatile memory device according to claim 8, wherein the step of forming the first filling constituents includes:

a step a of forming a first semiconductor layer inside each of the first through-holes such that the first semiconductor layer is physically in contact with the first wire; and a step b of forming a first metal electrode layer inside each of the first through-holes such that the first metal electrode layer is physically in contact with the first semiconductor layer, after the step a; and wherein the step of forming the second filling constituents includes:

a step c of forming a second electrode layer inside each of the first through-holes such that the second electrode layer is physically in contact with the second wire; and a step d of forming a second semiconductor layer inside each of the second through-holes such that the second semiconductor layer is physically in contact with the second electrode layer, after the step c.

10. The method of manufacturing the nonvolatile memory device according to claim 8, wherein the step for forming the first wires is performed by a damascene process in which wire material is filled into predetermined trenches by a CMP process after forming the trenches in the first interlayer insulating layer;

wherein the step for forming the second wires is performed in such a manner that the first resistance variable layer, the conductive layer and the second resistance variable layer are etched using a mask after the first resistance variable layer, the conductive layer and the second resistance variable layer are stacked together in this order; and wherein the step for forming the third wires is performed by a damascene process in which wire material is filled into predetermined trenches by a CMP process after forming the trenches in the second interlayer insulating layer.

* * * * *